United States Patent
Araki et al.

(10) Patent No.: US 11,417,820 B2
(45) Date of Patent: Aug. 16, 2022

(54) OXIDE SUPERCONDUCTOR AND METHOD FOR MANUFACTURING THE SAME

(71) Applicant: Kabushiki Kaisha Toshiba, Minato-ku (JP)

(72) Inventors: Takeshi Araki, Koto (JP); Mariko Hayashi, Shinagawa (JP); Hiroyuki Fuke, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 91 days.

(21) Appl. No.: 16/912,306

(22) Filed: Jun. 25, 2020

(65) Prior Publication Data

US 2020/0335684 A1  Oct. 22, 2020

Related U.S. Application Data

(60) Division of application No. 15/646,752, filed on Jul. 11, 2017, now Pat. No. 10,741,743, which is a (Continued)

(30) Foreign Application Priority Data

Sep. 16, 2015 (JP) .................................. 2015-183335

(51) Int. Cl.
*H01L 39/12* (2006.01)
*C04B 35/45* (2006.01)
(Continued)

(52) U.S. Cl.
CPC ........ *H01L 39/126* (2013.01); *C04B 35/4504* (2013.01); *C04B 35/4508* (2013.01); (Continued)

(58) Field of Classification Search
CPC ..... H01L 39/126; H01F 6/06; C04B 35/4508; C04B 35/624
See application file for complete search history.

(56) References Cited

U.S. PATENT DOCUMENTS

2005/0159298 A1  7/2005  Rupich et al.
2006/0058195 A1  3/2006  Araki et al.
(Continued)

FOREIGN PATENT DOCUMENTS

EP  2 641 887 A2  9/2013
EP  2 704 224 A1  3/2014
(Continued)

OTHER PUBLICATIONS

International Search Report dated Jun. 15, 2016 in PCT/JP2016/000477, filed on Jan. 29, 2016.
(Continued)

*Primary Examiner* — Paul A Wartalowicz
(74) *Attorney, Agent, or Firm* — Oblon, McClelland, Maier & Neustadt, L.L.P.

(57) ABSTRACT

An oxide superconductor includes: $REBa_2Cu_3O_{7-x}$ (RE being one element selected from a "RE element group" of Pr, Nd, Sm, Eu, Gd, Y, Tb, Dy, Ho, Er, Tm, Yb, and Lu). The RE includes at least three types of metallic elements (M1, M2, and M3), and the three types of metallic elements are any element of the RE element group selected in order. In an oxide system satisfying $R(M1) \leq 20$ mol % and $R(M2) \geq 60$ mol % and $R(M3) \leq 20$ mol %, R(M1) being an average metallic element ratio of M1 in M1+M2+M3, $SD(Ms) > 0.15$ is satisfied at a position at 50% of an average film thickness of a cross section including the c-axis, Ms being the metallic element of not larger of R(M1) and R(M3), SD(Ms) being a standard deviation/average value of a concentration of Ms.

8 Claims, 16 Drawing Sheets

Related U.S. Application Data continuation of application No. PCT/JP2016/000477, filed on Jan. 29, 2016.

(51) Int. Cl.
  *H01L 39/24* (2006.01)
  *C04B 35/622* (2006.01)
  *C04B 35/624* (2006.01)
  *H01L 39/14* (2006.01)

(52) U.S. Cl.
  CPC ...... *C04B 35/624* (2013.01); *C04B 35/62218* (2013.01); *H01L 39/2425* (2013.01); *H01L 39/2451* (2013.01); *C04B 2235/3215* (2013.01); *C04B 2235/3224* (2013.01); *C04B 2235/3225* (2013.01); *C04B 2235/3281* (2013.01); *C04B 2235/449* (2013.01); *C04B 2235/721* (2013.01); *C04B 2235/724* (2013.01); *C04B 2235/768* (2013.01); *H01L 39/148* (2013.01)

(56) References Cited

U.S. PATENT DOCUMENTS

| | | |
|---|---|---|
| 2006/0153969 A1 | 7/2006 | Araki et al. |
| 2008/0153709 A1 | 6/2008 | Rupich et al. |
| 2014/0031236 A1 | 1/2014 | Araki et al. |
| 2014/0066311 A1 | 3/2014 | Araki et al. |

FOREIGN PATENT DOCUMENTS

| | | |
|---|---|---|
| JP | 8-17621 | 1/1996 |
| JP | 2003-505888 | 2/2003 |
| JP | 2006-44963 | 2/2006 |
| JP | 2006-83022 | 3/2006 |
| JP | 2007-526199 | 9/2007 |
| JP | 2008-204958 | 9/2008 |

OTHER PUBLICATIONS

Written Opinion dated Jun. 15, 2016 in PCT/JP2016/000477, filed on Jan. 29, 2016.
Takeshi Araki. "Purified Coating Solution and Growth Scheme of the $YBa_2Cu_3O_7$-x Superconductors in Metal Organic Deposition Using Trifluoroacetates," Bulletin of The Chemical Society of Japan, 77, pp. 11, 2004.
Venkat Selvamanickam, et al., "High Performance 2G Wires: From R&D to Pilot-Scale Manufacturing," IEEE Transactions on Applied Superconductivity, vol. 19, No. 3, Jun. 2009, pp. 6.
Martin W. Rupich, et al., "Advances in second generation high temperature superconducting wire manufacturing and R&D at American Superconductor Corporation," Superconductor Science and Technology, 23, 2010, pp. 10.

| | | Int (cps) | | | | | | | | | | SD | Dmm |
|---|---|---|---|---|---|---|---|---|---|---|---|---|---|
| | | 1 | 2 | 3 | 4 | 5 | 6 | 7 | 8 | 9 | 10 | | |
| AR1 (10%Sm) | Sm | 80 | 73 | 65 | 76 | 76 | 64 | | | | | 0.091 | 1.26 |
| AR2 (10%Sm) | Sm | 79 | 69 | 64 | 82 | 64 | 79 | 76 | 69 | 74 | 78 | 0.087 | 1.16 |
| AR3 (10%Sm) | Sm | 80 | 71 | 68.5 | 79.5 | 66.5 | 79.5 | 75 | 69 | | | 0.076 | 1.20 |

| | | Int (cps) | | | | | | | | | | SD | Dmm |
|---|---|---|---|---|---|---|---|---|---|---|---|---|---|
| | | 1 | 2 | 3 | 4 | 5 | 6 | 7 | 8 | 9 | 10 | | |
| 1FS-X1 (10%Sm+10%Lu) | Sm | 82 | 28 | 75 | 86 | 88 | 82 | 51 | 107 | 124 | 139 | 0.378 | 5.02 |
| | Lu | 60 | 26 | 55 | 62 | 90 | 52 | 41 | 70 | 86 | 90 | 0.339 | 3.52 |
| 2FS-X1 (12.5%Sm+7.5%Lu) | Sm | 83 | 70 | 92 | 92 | 102 | 60 | 113 | 105 | 119 | 126 | 0.219 | 2.11 |
| | Lu | 75 | 62 | 77 | 84 | 65 | 45 | 56 | 104 | 111 | 125 | 0.320 | 2.77 |
| 2FS-X2 (15%Sm+5%Lu) | Sm | 114 | 138 | 142 | 130 | 153 | 125 | 146 | 140 | 155 | 158 | 0.100 | 1.39 |
| | Lu | 69 | 65 | 64 | 67 | 55 | 77 | 58 | 91 | 97 | 102 | 0.223 | 1.85 |
| 2FS-X3 (17.5%Sm+2.5%Lu) | Sm | 119 | 134 | 130 | 130 | 148 | 123 | 138 | 135 | 147 | 144 | 0.072 | 1.24 |
| | Lu | 79 | 88.33 | 78 | 89 | 85 | 96 | 86 | 90.33 | 92.33 | 94 | 0.068 | 1.23 |

FIG.14
|  |  | Int (cps) |  |  |  |  |  |  |  |  |  | SD | Dmm |
|---|---|---|---|---|---|---|---|---|---|---|---|---|---|
|  |  | 1 | 2 | 3 | 4 | 5 | 6 | 7 | 8 | 9 | 10 |  |  |
| AR4 | Dy | 76 | 64 | 65 | 76 | 80 | 73 | 79 | 69 | 68 | 78 | 0.083 | 1.26 |
| (10%Dy+10%Lu) | Lu | 67 | 79 | 69 | 70 | 80 | 80 | 72 | 76 | 68 | 79 | 0.071 | 1.19 |
| AR6 | Dy | 73 | 79 | 73 | 65 | 67 | 75 | 71 | 69 | 71 | 74 | 0.059 | 1.22 |
| (10%Dy+10%Lu) | Lu | 65 | 77 | 80 | 64 | 73 | 79 | 69 | 77 | 75 | 77 | 0.077 | 1.25 |
| AR7 | Dy | 77 | 69 | 74 | 78 | 64 | 79 | 65 | 81 | 69 | 78 | 0.087 | 1.28 |
| (10%Dy+10%Lu) | Lu | 75 | 78 | 63 | 69 | 79 | 65 | 81 | 77 | 67 | 79 | 0.090 | 1.29 |
YBCO 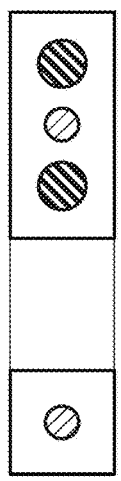
FIG.15A
FIG.15B
SmBCO 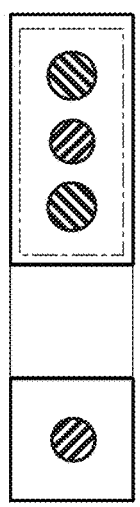
FIG.15C
FIG.15D
LuBCO 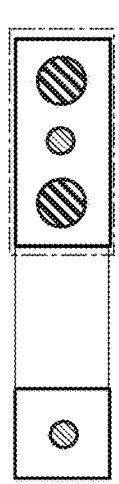
FIG.15E
FIG.15F

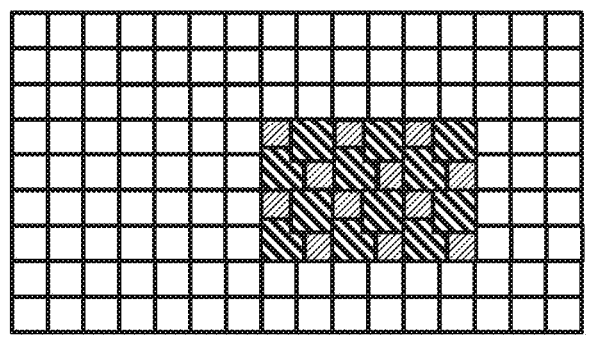
FIG.17A
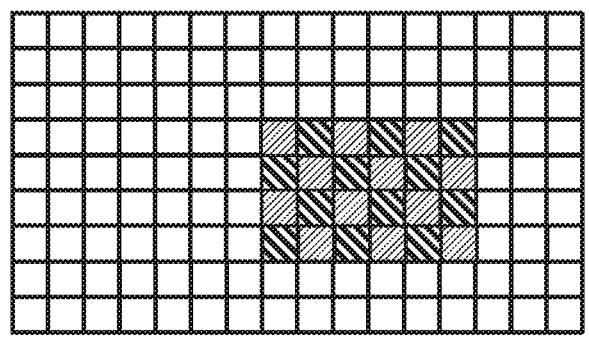
FIG.17B
FIG.18
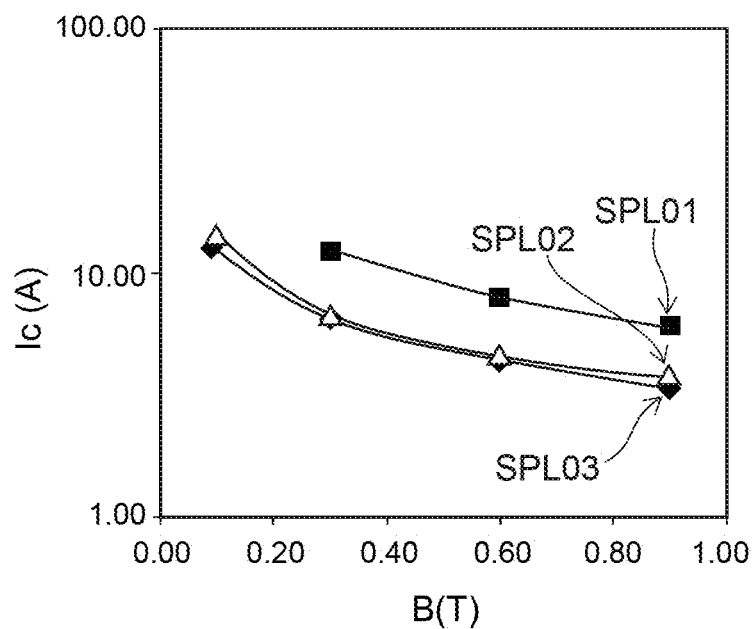

OXIDE SUPERCONDUCTOR AND METHOD FOR MANUFACTURING THE SAME

CROSS-REFERENCE TO RELATED APPLICATIONS

This application is a Divisional of U.S. application Ser. No. 15/646,752 filed on Jul. 11, 2017, which is a Continuation of National Stage of application PCT/JP2016/000477, filed on Jan. 29, 2016.

FIELD

Embodiments of the invention relate to an oxide superconductor and a method for manufacturing the same.

BACKGROUND

There are expectations for applications of superconductors in, for example, power transmission cables, fusion reactors, magnetically levitated trains, particle accelerators, magnetic diagnostic devices (MRI), etc. It is desirable to increase the critical current density of the superconductor. Thereby, a large current can be caused to flow through the same cross-sectional area. For example, it is desirable to obtain a high critical current density in a magnetic field.

Superconduction is the phenomenon in which the resistance value is completely zero, discovered using mercury by Kamerring Onnes of the Netherlands who developed a refrigerating machine. Subsequently, the superconducting dislocation temperature (Tc) of the upper limit according to the BCS theory was thought to be 39 K. This was the Tc of a type-I superconductor. A type-II superconductor that was discovered by Bednorz et al. in 1986 had results exceeding 39 K. This led to the development of an oxide superconductor usable at the temperature of liquid nitrogen. The oxide superconductor is a type-II superconductor in which it is possible for superconducting and non-superconducting states to coexist. Today, many high temperature oxide superconductors that are usable at the temperature of liquid nitrogen are sold in lots that are 500 m long. There are expectations for the application of superconducting materials to various large-scale devices such as superconducting power transmission cables, fusion reactors, magnetically levitated trains, particle accelerators, magnetic diagnostic devices (MRI), etc.

A bismuth-based superconducting wire which is called the first generation and an yttrium-based superconducting wire which is called the second generation are the major superconducting wires developed as high temperature oxide superconductors. For the first generation in which not less than 60 vol % of silver is used, manufacturers have successively withdrawn; and there are few companies in the world currently manufacturing. On the other hand, for the second generation in which the base member is inexpensive and the physical strength is superior, the total length of strand sold has exceeded 3,000 km. A 50 MVA direct current power transmission cable system made using a large amount of wire already has been in actual operation for more than two years as of August of 2014. A direct current power transmission cable system having a capacity of 500 MVA has been operating from September of 2014. The power transmission capacity of 500 MVA is large-scale electrical power corresponding to nearly 50% of the electrical power of a standard nuclear reactor.

Cumulatively, more than 3,000 km of wire has been sold. All of more than 20 km of strand length actually delivered and actually applied is made by TFA-MOD (Metal Organic Deposition using TriFluoroAcetates). TFA-MOD is the first method that has been actually applied and can stably manufacture 500 m long wire and supply large amounts [1]. Other major manufacturing methods of the second generation include Pulsed Laser Deposition and Metal Organic Chemical Vapor Deposition. The composition control of these methods is problematic; and stable mass production of 500 m long wire is not being performed at the current point in time. Therefore, at the current point in time, the wire market share of TFA-MOD is substantially 100%.

This fact does not negate the future of Pulsed Laser Deposition or Metal Organic Chemical Vapor Deposition. Mass production by physical vapor deposition in which composition control is difficult would be possible if technology is developed so that three types of elements can be projected through a vacuum, have atomic weights differing by a factor of 2 or more, and can be controlled by an inexpensive method to have a composition shift like TFA-MOD of 1% or less. This problem has been unresolved for more than 28 years since 1987.

On the other hand, wires by Pulsed Laser Deposition or Metal Organic Chemical Vapor Deposition are in the lead for coil applications in which high magnetic field characteristics are necessary. Because artificial pins for improving the magnetic field characteristics are easily introduced, the wires by these methods are one step ahead for the magnetic field characteristics. As described above, the composition control for these methods is difficult; and there is no report of mass production or implementation of a wire on the order of 500 m by these methods.

On the other hand, TFA-MOD, which is being used in mass production, had problems in the past. If no countermeasures are performed in TFA-MOD, the maximum thickness of a superconducting film obtained by one film formation is about 0.30 μm. In this method, organic substances having a density of about 2 $g/cm^3$ change to metal oxides of 3 to 4 $g/cm^3$ in the decomposition reaction in the pre-bake; and the molecular weight (the formula weight) decreases drastically. Therefore, the volumetric reduction rate is about 85%. Accordingly, cracks occur easily due to a large drying stress. The critical film thickness in the highly purified solution is about 0.30 μm. Because a large current value is necessary in the superconducting cable, a film thickness of about 1 μm is necessary. Therefore, for TFA-MOD, increasing the film thickness has been attempted by repeated coating and the like.

Increasing the film thickness by repeated coating used in conventional MOD was difficult to apply to TFA-MOD. The oxides that are formed after the pre-bake contact trifluoroacetic acid which is a strong acid having a pH near 0 in the next film formation. A heterogeneous interface is formed by the reaction of the strong acid and the oxides. The characteristics degrade from the heterogeneous interface as the starting point. If the yield is 95% for 10 m wire, in the case where a 500 m long wire is manufactured by three coatings such technology, a good part would be obtained only once every 200 times. Technology for a thicker one-coating film thickness [2] is necessary for TFA-MOD.

The crack preventing agent used for one coating having a thicker film thickness is an organic substance. It was considered that many crack preventing agents would exist among the more than a million types of organic substances. However, from recent research, it is known that there are only two systems and about ten types of film thickness-increasing materials that are applicable to TFA-MOD. For a wire made by technology for a thicker one-coating film thickness, an unstable interface such as that recited above does not exist; and the yield improves drastically. It is considered that this technology is one driving force of the rapid progress of TFA-MOD that has attained substantially 100% of the market share.

The fields of application of superconducting wires is broadly divided into power transmission cable applications which are used with magnetic fields of substantially zero, and coil applications which are used under a strong magnetic field. Applications of wires made by TFA-MOD which is the first process that made it possible to supply large amounts of wire mainly are for power transmission cables at the current point in time. An artificial pin is necessary to use the wire made by TFA-MOD in a magnetic field. In TFA-MOD that makes the superconductor from a homogeneous solution [3], the size of the artificial pin easily becomes larger than those of other methods. Therefore, the magnetic field characteristics did not improve. The wires made by TFA-MOD could not be utilized in a magnetic field.

The artificial pin that improves the magnetic field characteristics is, for example, a non-superconducting region formed inside the superconductor. The coexistence of the non-superconducting region is possible in a type-II superconductor. If the quantum flux lines and the strong magnetic field created by the superconduction are trapped by the artificial pin. The other portions stably function as a superconductor; and the characteristics in the magnetic field are maintained. The ease of the trapping of the quantum flux line by the artificial pin has a relationship with the size of the artificial pin.

The artificial pin is a non-superconducting portion. A force (a pinning force) that pushes back the flux is generated at the interface between the artificial pin and the superconducting portion. It is considered that the trapping by the pinning force is realized to the utmost as the size of the artificial pin approaches the size at which one quantum flux exists. When the size of the artificial pin becomes large and multiple quantum flux exist inside the artificial pin, the Lorentz force acts on each of the multiple quantum flux and pushes the adjacent quantum flux. Therefore, in such a case, the quantum flux easily crosses the interface and enters the superconducting portion. It is considered that the superconducting characteristics degrade due to the energy loss caused thereby. The artificial pin size becomes large in the heat treatment in almost all reports to date.

The increase of the size of the artificial pin is disadvantageous also from the aspect of the number of artificial pins or the density of the artificial pins. It is assumed that the artificial pin has a particle configuration; and it is assumed that the artificial pin obtained has a radius that is twice the target radius. The volume of each of the multiple artificial pins is 8 times the assumed size; and the density of the artificial pins per introduced substance amount is ⅛. In the case where an artificial pin having a size of 3 nm is attempted but an artificial pin having a size of 30 nm is obtained, the volume of the obtained artificial pin is 1000 times the attempted size. The number of artificial pins obtained becomes 1/1000 of the number of artificial pins attempted. This is the actual state of the artificial pins formed by TFA-MOD in which the homogeneity is superior but the improvement of the magnetic field characteristics is difficult.

The optimal size of the artificial pin may be shifted from 3 nm due to the temperature dependence or the magnetic field dependence. There have been no actual results or measurement results in the past for the formation of a homogeneous artificial pin having a size of 3 nm. Therefore, it is unclear whether or not the size of 3 nm is most effective.

In an attempt to form an artificial pin having a 3 nm size, it has been attempted to form an artificial pin of $BaZrO_3$ and the like by PLD and MOCVD which are physical vapor deposition. It is considered that the artificial pins that can be made by PLD are broadly divided into two types. One is an artificial pin for which particle growth and the like are performed independently without effecting the perovskite structure. The other is an artificial pin having a correlation with the perovskite structure.

For the type in which the artificial pin is formed as foreign matter without having a correlation with the perovskite structure, the film formation temperature is a high temperature of 700 degrees C. or more. Therefore, the separation between the artificial pin and the superconductor having the perovskite structure becomes severe. It is considered that the reason there are substantially no reports of this type is because the artificial pin size is 100 nm to 1 μm and there is no effect for both size and amount.

On the other hand, for PLD, there are substances that form an artificial pin while having a correlation with the perovskite structure. Such a substance is, for example, $BaZrO_3$. The size of the artificial pin can be relatively small to form the artificial pin while having the correlation. While an observation image having a minimum of 6 nm has been reported, it is considered that the average is 10 nm or more. However, because this type of substance has a correlation with the YBCO layer, this type of substance affects the YBCO layer and causes a decrease of the number of oxygen atoms and degradation of the superconducting characteristics of the superconductor. The decrease of the critical temperature (Tc) is caused to occur, which can be said to be crucial to the superconductor. For a heterogeneous wire in which the critical temperature Tc decreases by location, the coil design and the implementation is difficult.

There is also a report that Tc substantially does not decrease in the case where the $BaZrO_3$ amount is extremely low. In the report, the Tc measurement is performed using a faint current. For a wire that has a cause of instability in the internal structure of the wire, nonuniformity occurs when the current value is increased; and the characteristic degradation becomes large. It is considered that this is one reason that the application to coils does not progress for wires that are obtained by physical vapor deposition and have unstable lengths.

Generally, heating is performed to not less than 700 degrees C. when the superconducting cable is a film in the film formation by physical vapor deposition such as PLD, MOCVD, etc. There is no effect on the magnetic field characteristic improvement as recited above when forming an artificial pin that does not affect the perovskite structure of the superconductor. If an artificial pin that affects the perovskite structure is formed, the Tc decreases; and nonuniformity of the interior occurs. It is considered that the size of the artificial pin has an average of about 10 nm and minimum of about 6 nm, which is not a size that has an effect on the magnetic field characteristic improvement. Therefore, it is considered that new technology not existing in the past is necessary for the mass production of a practical wire by physical vapor deposition such as PLD, MOCVD, etc.

On the other hand, even for TFA-MOD which has substantially 100% of the market share of cable applications, the realization of the artificial pin was still far from certain. A Tc of 90.7 K is maintained if an artificial pin of $Dy_2O_3$ is formed. This is because $Dy_2O_3$ grows separately from YBCO. The size of the artificial pin is 20 nm to 30 nm; and there are substantially no effects.

On the other hand, in the case where a substance that affects the perovskite structure is introduced, the effects on the internal structure made by TFA-MOD started from the homogeneous gel film are extremely large. Therefore, the perovskite structure itself is not formed and a non-superconductor is formed. The superconductor made by TFA-MOD is affected by impurities, etc., more easily than is physical vapor deposition. By TFA-MOD, to begin with, the formation of an artificial pin of $BaZrO_3$, etc., is difficult. Even in the case where the artificial pin is formed, the Tc decreases or the heterogeneity occurs more strongly.

In the Y-based superconducting wire as described above, it is necessary to improve the Jc-B characteristic by introducing the artificial pin while maintaining Tc. However, all of the sizes of the artificial pins become large for the artificial pins when the perovskite structure and Tc are maintained. In a system that affects the perovskite structure, there are various negative effects; and it is not practical. Therefore, a completely new method is desirable for a superconductor in which the perovskite structure is maintained and only a portion of the superconductor functions as the artificial pin.

Currently, two methods are being developed as solutions. An application has been filed for part of these. Both are based on an artificial pin having a unit cell size. Both are atomic substitution-type artificial pins that become artificial pins by atomic substitution. This is called ARP (Atom-replaced Pinning). In one, a SmBCO unit cell is dispersed in the YBCO perovskite structure; and substitution is performed for Ba and Sm of the SmBCO. In this method, the unit cell due to the so-called Ba substitution is utilized as the non-superconductor.

In the other method, a PrBCO unit cell is formed in the YBCO perovskite structure. While it is widely known that PrBCO is non-superconducting, the principle of becoming non-superconducting is unclear. In the current state, the principle of Pr becoming non-superconducting is temporarily considered to be as follows. It is considered that PrBCO is trivalent at the vicinity of 800 degrees C. to form the perovskite structure. A normal perovskite structure is formed. However, when cooled, it is considered to be an intermediate body between trivalent and tetravalent. In such a case, the number of oxygen atoms between two unit cells increases; and the c-axis length becomes short. The XRD measurement results affirm this hypothesis. The increase of the number of oxygen atoms causes degradation of the superconducting characteristics. In the case of Pr, while the detailed mechanism is unclear, it is highly likely that the PrBCO completely becomes non-superconducting and four adjacent unit cells in the a/b plane are caused to become non-superconducting.

If the process recited above is correct, characteristic degradation of about 5 times the introduced Pr amount occurs. Moreover, the degradation of the characteristics of 5 times has been confirmed many times from experimental results. However, even in the case where, in the width direction, the size is only three unit cells, the artificial pin has a size of 1.2 nm. While there is no past example of such a small size of the artificial pin, this is too small for the target of 3 nm; and the effect is small.

A superconductor obtained by causing PrBCO and YBCO to coexist is in an extreme dispersion state. In the extreme dispersion state, the PrBCO is dispersed in solitary unit cells. It is known from experimental results that the SmBCO unit cells formed by mixing SmBCO with YBCO also have extreme dispersion. If Ba and Sm are substituted for the SmBCO unit cell, the unit cell as an entirety can be a non-superconducting artificial pin. Further, if the adjacent unit cells are affected, a unit cell of a maximum of about 5 times may become an artificial pin. However, even in such a case, the size of the artificial pin is only 1.2 nm.

By forming the artificial pin at the atomic level by either method, the size is too small. By aggregating these artificial pins, the size can be in the vicinity of 3 nm; and therefore, a higher critical current density in a magnetic field can be expected.

BRIEF DESCRIPTION OF THE DRAWINGS

FIG. 14 is a table showing the analysis results of the oxide superconductor;

FIG. 15A to FIG. 15F are schematic views showing unit cells of the oxide superconductor;

FIG. 17A and FIG. 17B are schematic views showing configurations of the superconductor;

FIG. 18 is a graph showing characteristics of the oxide superconductor;

DETAILED DESCRIPTION

According to the embodiment of the invention, an oxide superconductor is provided. The oxide superconductor includes: $REBa_2Cu_3O_{7-x}$ (RE being one element selected from a "RE element group" of Pr, Nd, Sm, Eu, Gd, Y, Tb, Dy, Ho, Er, Tm, Yb, and Lu) including fluorine and carbon, the fluorine having a concentration of not less than $2.0 \times 10^{16}$ atoms/cc and not more than $5.0 \times 1^{19}$ atoms/cc, the carbon having a concentration of not less than $1.0 \times 10^{18}$ atoms/cc and not more than $5.0 \times 10^{20}$ atoms/cc, RE including at least three types of metallic elements (M1, M2, and M3), the three types of metallic elements being any element of the RE element group selected in order, $R(M1) \leq 20$ mol % and $R(M2) \geq 60$ mol % and $R(M3) \leq 20$ mol % being satisfied, $R(M1)$ being an average metallic element ratio of M1 in M1+M2+M3. The $REBa_2Cu_3O_{7-x}$ has a single perovskite structure oriented in a c-axis. $SD(Ms) > 0.15$ is satisfied at a position at 50% of an average film thickness of a cross section including the c-axis, Ms being the metallic element of not larger of $R(M1)$ or $R(M3)$, $SD(Ms)$ being the standard deviation/average value of a concentration of Ms.

For, example, the embodiment of the invention provides an oxide superconductor and a method for manufacturing the oxide superconductor that can increase the critical current density in a magnetic field.

An embodiment of the invention relates to, for example, an oxide superconducting cable material and coil applications.

The embodiment relates to, for example, applications in a magnetic field. The embodiment is applied to a superconducting coil, a superconducting magnet, an MRI device, a magnetically levitated train, SMES (Superconducting Magnetic Energy Storage), etc. For example, the embodiment is applied to a power transmission cable used under conditions in which a magnetic field is applied. The embodiment is related to, for example, a Y-based oxide superconducting cable. The Y-based oxide superconducting cable is used in such applications.

Figure 1A:
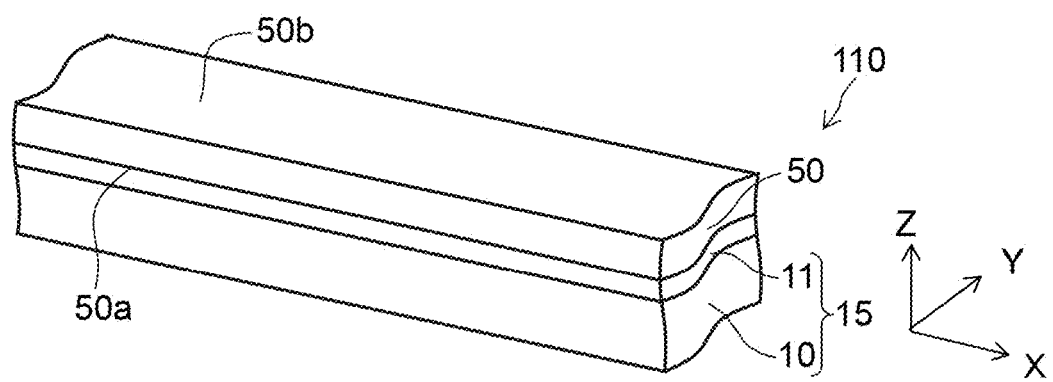
FIG. 1A and FIG. 1B are schematic views showing an oxide superconductor according to the embodiment.
Figure 1B:
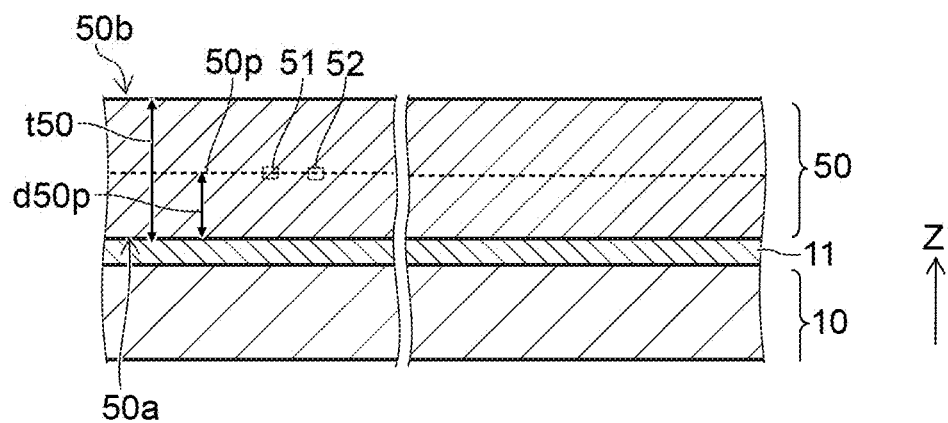

FIG. 1A and FIG. 1B are schematic views showing an oxide superconductor according to the embodiment.

FIG. 1A is a perspective view; and FIG. 1B is a cross-sectional view.

As shown in FIG. 1A, an oxide superconductor 110 according to the embodiment includes a base member 15 and an oxide layer 50. The oxide layer 50 is provided on the base member 15.

In the example, the base member 15 includes a substrate 10 and a foundation layer 11. The foundation layer 11 is provided between the substrate 10 and the oxide layer 50. In other words, a foundation layer 11 is provided on the substrate 10; and the oxide layer 50 is provided on the foundation layer 11.

As shown in FIG. 1A, the oxide layer 50 has a first surface 50a and a second surface 50b. The first surface 50a is a surface on the base member 15 side. The first surface 50a opposes the base member 15. The second surface 50b is a surface on the side opposite to the first surface 50a. The first surface 50a is, for example, the lower surface; and the second surface 50b is, for example, the upper surface.

A first direction from the first surface 50a toward the second surface 50b is taken as, for example, a Z-axis direction. One direction perpendicular to the Z-axis direction is taken as an X-axis direction. A direction perpendicular to the Z-axis direction and the X-axis direction is taken as a Y-axis direction.

The distance along the first direction between the first surface 50a and the second surface 50b corresponds to the thickness of the oxide layer 50. An unevenness having a maximum of about 70 nm forms in the oxide layer 50 surface manufactured by TFA-MOD due to the growth mechanism of the oxide layer 50 surface. Fluctuation of the manufacturing processes, etc., also exists. Due to these causes, there are cases where the thickness of the oxide layer 50 is nonuniform. In such a case, the average value of the thickness of the oxide layer 50 is used. For example, the distance along the first direction between the first surface 50a and the second surface 50b is determined at multiple positions of the oxide layer 50. For example, the thickness is determined using an electron microscope image of the cross section of the oxide layer 50, etc. The thickness also is determined from the film formation surface area and the substance amount by ICP analysis of another sample. The average value is determined from the multiple values that are determined. Thereby, an average thickness t50 of the oxide layer 50 is obtained.

The oxide layer 50 has a position 50p at ½ of the average thickness t50. A distance d50p along the first direction between the position 50p and the first surface 50a is ½ of the average thickness t50.

The oxide layer 50 includes multiple regions (e.g., a first region 51, a second region 52, etc.) positioned at the position 50p. The distances along the first direction between the first surface 50a and the center of each of these regions are ½ of the average thickness t50.

For example, in the cross section of the oxide layer 50, these regions have a first side along the first direction and the second side along a direction orthogonal to the first direction. The length along the first direction of the first side is, for example, 5 nm. The length of the second side along the direction orthogonal to the first direction is, for example, 5 nm. These regions are, for example, 5 nm square.

For example, analysis, etc., may be performed for, for example, the multiple regions (e.g., the first region 51, the second region 52, etc.) recited above included in the oxide layer 50.

The substrate 10 is, for example, a monocrystalline substrate. The substrate 10 includes, for example, at least one of $LaAlO_3$, $SrTiO_3$, $NdGaO_3$, $Al_2O_3$, MgO, or YSZ (yttria stabilized zirconia).

In the case where the foundation layer 11 is provided, the foundation layer 11 includes, for example, at least one of $CeO_2$, $LaMnO_3$, $SrTiO_3$, or $LaAlO_3$. The foundation layer 11 may be, for example, one layer. The foundation layer 11 may include multiple layers. The foundation layer 11 may include, for example, a stacked body of a $CeO_2$ layer, a YSZ layer, and a $Y_2O_3$ layer.

For example, the lattice constant of the base member 15 substantially matches the lattice constant of the oxide layer 50. The lattice constant is the lattice length along one direction substantially perpendicular to the first direction (the Z-axis direction). In this case, three types of matching exist.

For example, the lattice constant of the base member 15 is substantially the same as the lattice constant of the oxide layer 50. In other words, the lattice constant of the base member 15 is not less than 0.93 times and not more than 1.07 times the lattice constant of the oxide layer 50.

Or, the lattice constant of the base member 15 is substantially the same as 2½ times the lattice constant of the oxide layer 50. In other words, the lattice constant of the base member 15 is not less than 1.32 times and not more than 1.54 times the lattice constant of the oxide layer 50.

Or, the lattice constant of the base member 15 is substantially the same as (1/(2½)) times the lattice constant of the oxide layer 50. In other words, the lattice constant of the base member 15 is not less than 0.649 times and not more than 0.758 times the lattice constant of the oxide layer 50.

The lattice constant of the oxide layer 50 along a direction perpendicular to the first direction from the first surface 50a toward the second surface 50b is a first lattice constant. In such a case, the base member 15 has one of a second lattice constant along the perpendicular direction recited above that is not less than 0.93 times and not more than 0.107 times the first lattice constant, a third lattice constant along the perpendicular direction recited above that is not less than 1.32 times and not more than 1.54 times the first lattice constant, or a fourth lattice constant along the perpendicular direction recited above that is not less than 0.649 times and not more than 0.758 times the first lattice constant.

For example, the substrate 10 has one of a lattice constant along the perpendicular direction recited above that is not less than 0.93 times and not more than 0.107 times the first lattice constant, a lattice constant along the perpendicular direction recited above that is not less than 1.32 times and not more than 1.54 times the first lattice constant, or a lattice constant along the perpendicular direction recited above that is not less than 0.649 times and not more than 0.758 times the first lattice constant.

For example, the foundation layer 11 has one of a lattice constant along the perpendicular direction recited above that is not less than 0.93 times and not more than 0.107 times the first lattice constant, a lattice constant along the perpendicular direction recited above that is not less than 1.32 times and not more than 1.54 times the first lattice constant, or a lattice constant along the perpendicular direction recited above that is not less than 0.649 times and not more than 0.758 times the first lattice constant.

The oxide layer 50 includes, for example, fluorine having a concentration of not less than $2.0 \times 10^{16}$ atoms/cc and not more than $5.0 \times 10^{19}$ atoms/cc, and carbon having a concentration of not less than $1.0 \times 10^{18}$ atoms/cc and not more than $5.0 \times 10^{20}$ atoms/cc.

The concentration of fluorine (e.g., the residual fluorine amount) and the concentration of carbon (e.g., the residual carbon amount) recited above are, for example, the amounts obtained by TFA-MOD (Metal Organic Deposition using TriFluoroAcetates). The characteristics degrade when the residual carbon amount increases. By using the heat treatment pattern, etc., according to the embodiment, the residual carbon amount can be suppressed; and good superconducting characteristics are obtained. Good conducting characteristics are obtained when the residual fluorine amount is not too excessive.

In the embodiment, the oxide layer 50 includes $REBa_2Cu_3O_{7-x}$ (RE being one element selected from the "RE element group" of Pr, Nd, Sm, Eu, Gd, Y, Tb, Dy, Ho, Er, Tm, Yb, and Lu). RE includes at least three types of metallic elements (M1, M2, and M3). Also, the three types of metallic elements are any element of the RE element group selected in order. $R(M1) \leq 20$ mol %, $R(M2) \geq 60$ mol %, and $R(M3) \leq 20$ mol % are satisfied, where $R(M1)$ is the average metallic element ratio of M1 in M1+M2+M3. The oxide layer 50 is oxide-based.

The $REBa_2Cu_3O_{7-x}$ recited above has a single perovskite structure oriented in the c-axis. The angle (the absolute value) between the c-axis and the Z-axis direction is, for example, 4 degrees or less. Ms is the metallic element of not larger of R(M1) or R(M3). SD(Ms) is the standard deviation/average value of the concentration of Ms at the position at 50% of the average film thickness of a cross section including the c-axis. The SD (Standard Distribution) is a deviation index. Concentration analysis at, for example, 10 points is performed, for example, at 50% of the average film thickness of the cross section including the c-axis; and SD(Ms) >0.15 is satisfied in the embodiment in which the concentration of Ms is determined. For example, SD(Ms)>0.25 is satisfied.

Msmax≥1.5×Msmin is satisfied, where Msmax and Msmin respectively are the maximum value and minimum value of the concentration of Ms. For example, Msmax≥2.3×Msmin is satisfied.

For example, the oxide layer 50 is provided on the base member 15 or provided on the base member 15 including the intermediate layer 11. For example, M1 recited above is Pr, Nd, or Sm.

The a/b plane is a plane regulated by the a-axis and the b-axis. The a/b plane is a plane that includes the a-axis and the b-axis. The a/b plane is, for example, the c-plane.

The oxide superconductor 110 according to the embodiment includes the oxide layer 50 of $REBa_2Cu_3O_{7-x}$. The oxide layer 50 includes, for example, fluorine having a concentration of not less than $2.0 \times 10^{16}$ atoms/cm$^3$ and not more than $5.0 \times 10^{19}$ atoms/cm$^3$, and carbon having a concentration of not less than $1.0 \times 10^{18}$ atoms/cm$^3$ and not more than $5.0 \times 10^{20}$ atoms/cm$^3$.

In the $REBa_2Cu_3O_{7-x}$ of the oxide layer 50, RE includes first to third elements. The first element is one selected from a RE element group consisting of Pr, Nd, Sm, Eu, Gd, Y, Tb, Dy, Ho, Er, Tm, Yb, and Lu. The second element is one selected from any from the RE element group after the first element. The third element is one selected from any from the RE element group after the second element.

The oxide layer 50 has a first composition ratio (e.g., mole %) that is an average for the first element in the oxide layer 50, a second composition ratio (e.g., mole %) that is an average for the second element in the oxide layer 50, and a third composition ratio (e.g., mole %) that is an average for the third element in the oxide layer 50. The ratio of the first composition ratio to the total of the first composition ratio, the second composition ratio, and the third composition ratio is 20% or less. The ratio of the second composition ratio to the total is 60% or more. The ratio of the third composition ratio to the total is 20% or less.

The oxide layer 50 has a perovskite structure. The perovskite structure is oriented in the c-axis. The absolute value of the angle between the c-axis and the Z-axis direction (the first direction from the first surface 50a toward the second surface 50b) is, for example, 4 degrees or less. For example, the perovskite structure is single. For example, the crystal axis of the first region 51 is aligned with the crystal axis of the second region 52. For example, the crystal of the first region 51 is continuous with the crystal of the second region 52.

As shown in FIG. 1B, the oxide layer 50 has the position 50p at ½ of the average thickness t50 of the oxide layer 50. The position 50p is, for example, multiple. The number of positions 50p is, for example, 10. For example, the multiple positions 50p are included in a cross section including the c-axis. For example, the multiple positions 50p are arranged along a direction (e.g., the X-axis direction, the Y-axis direction, etc.) perpendicular to the Z-axis direction.

The oxide layer 50 has concentrations of elements at each of the multiple positions 50$p$. The oxide layer 50 has multiple first concentrations C1 of the first element at the multiple positions 50$p$, and multiple third concentrations C3 of the third element at the multiple positions 50$p$. For example, in the case where the number of multiple positions 50$p$ is 10, the oxide layer 50 has the multiple first concentrations C1 of the first element at ten positions 50$p$ and the multiple third concentrations C3 of the third element at ten positions 50$p$.

Multiple first values V1 are determined as follows. The multiple first values V1 respectively are the multiple first concentrations C1 when the first composition ratio (the average composition ratio of the first element) is not more than the third composition ratio (the average composition ratio of the third element). The multiple first values V1 respectively are the multiple third concentrations C3 when the first composition ratio is larger than the third composition ratio. In the case where the number of multiple positions 50$p$ is 10, the number of multiple first values V1 is 10.

In the embodiment, the multiple first values V1 are as follows. The ratio of a standard deviation σV1 of the multiple first values V1 to an average value AV1 of the multiple first values V1 (σV1/AV1) is higher than 0.15. In the embodiment, for example, the ratio (σV1/AV1) of the standard deviation σV1 of the multiple first values V1 to the average value AV1 may be higher than 0.25.

In the embodiment, for example, the maximum value of the multiple first values V1 is not less than 1.5 times the minimum value of the multiple first values V1. In the embodiment, the maximum value of the multiple first values V1 may be not less than 2.3 times the minimum value of the multiple first values V1.

In the embodiment, the first element recited above is, for example, Pr, Nd, or Sm. The third element recited above is, for example, Lu. The second element recited above is Y.

In the embodiment, the total of the ratio of the first composition ratio recited above, the ratio of the second composition ratio recited above, and the ratio of the third composition ratio recited above is substantially 100%. For example, the difference between the first composition ratio and the third composition ratio is not more than 1/10 of the first composition ratio. The difference may be not more than 1/15.

In the embodiment, an artificial pin of the appropriate size is introduced to the oxide superconductor 110 (the oxide layer 50). Thereby, for example, the magnetic field characteristics can be improved. For example, in a Y-based superconducting wire, the artificial pin is introduced while maintaining a high critical temperature (Tc). Thereby, the current density-magnetic field characteristic (the Jc-B characteristic) improves. When attempting to introduce the artificial pin while maintaining a perovskite structure in which Tc is maintained, the size of the artificial pin easily becomes excessively large. Therefore, the perovskite structure is affected; and negative effects on the characteristics occur. In the embodiment, a small artificial pin can be introduced.

In the embodiment, the size of the artificial pin is, for example, substantially about 3 nm. The likelihood is high that a unit cell that is non-superconducting may cause the four cells adjacent in the a/b plane to become non-superconducting. A similar tendency is seen for PrBCO which is non-superconducting and has a perovskite structure and for a SmBCO superconductor which becomes non-superconducting by Ba substitution.

In the embodiment, a cluster is provided in the oxide layer 50. In the cluster, a unit cell that is non-superconducting and a superconductor are arranged alternately. It is considered that the entire cluster is non-superconducting.

For example, the oxide layer 50 according to the embodiment is formed by TFA-MOD (Metal Organic Deposition using TriFluoroAcetates). Nd or Sm easily becomes the artificial pin. In the case of Pr, the unit cell becomes the artificial pin from the beginning. It is difficult to form the desired artificial pin using Nd, Sm, or Pr by TFA-MOD. Artificial pins that include these elements are clustered. Other elements also may be used if such elements become non-superconducting. Similarly to Nd, Sm, and Pr, there is a possibility that the four unit cells around the other elements may become non-superconducting. In the embodiment, clustering is realized in which the elements are aggregated. The size of the artificial pin can be controlled.

The processing of a main bake is performed on, for example, a base material used to form the oxide layer 50 at, for example, a temperature of 725 degrees C. to 850 degrees C. At this time, a unit cell is formed from a pseudo-liquid layer. At this time, a region (a large cell size region) that has a cell size larger than the unit cell of the superconductor and a region (a small cell size region) that has a cell size smaller than the unit cell are provided in the superconductor.

An element that corresponds to a large cell size is used as M1. An element that corresponds to a small cell size is used as M3. An element that corresponds to a medium cell size is used as M2. The element M2 is used as the parent phase of the oxide layer 50. The proportion of M2 of the parent phase is, for example, 60 mol % or more. The proportions of M1 and M3 are, for example, 20 mol % or less each. When the proportions of M1 and M3 exceed 20 mol %, the parent phase is unstable and unusual phases increase.

M1, M2, and M3 are mixed in the solution. For example, at least one of Pr, Nd, or Sm that has a large atomic radius and decomposes easily is used as M1. In such a case, it is desirable to use pentafluoropropionic acid (PFP) and use a process that suppresses the decomposition. By subsequently substituting trifluoroacetic acid (TFA) for the PFP, the effect of the residual PFP is reduced; and good characteristics are obtained easily. In the case where an element that is different from Pr, Nd, and Sm is used, synthesis with a TFA salt is possible. Mixing at any proportion is possible for the TFA salt-based solution.

The bake is performed after the mixed solution preparation. As the baking conditions of the bake, for example, the same conditions as the appropriate conditions when using M2 of the parent phase are used; or conditions similar to such appropriate conditions are used. Conditions that are different from the appropriate conditions when using M2 may be used according to the mixing ratio of M1 and/or M3. The base member 15 that is used in the film formation is, for example, a monocrystal. The base member 15 may be a metal tape. For example, an intermediate layer (e.g., the foundation layer 11) may be provided on the metal tape.

In the embodiment, it is considered that the artificial pins that include M1 and M3 can be clustered due to the difference between the sizes of the unit cells when forming the perovskite structure. A partial clustering state occurs when the difference is excessively small. In the partial clustering state, clusters are formed in a portion of the regions. Even when a non-conducting unit cell exists in a region in a partial clustering state, the effect of the artificial pin becomes small.

The decrease of the ionic radius is not large even when the atomic number increases for, for example, elements in which the size of the ionic radius is smaller than that of Tb, i.e., for example, elements aftward in the order listed in the group of Dy, Ho, Er, Tm, Yb, and Lu. Therefore, the size difference is small; and it is difficult for clustering to occur. Clustering occurs more easily by using two elements that are not adjacent in the order listed in the group of Dy, Ho, Er, Tm, Yb, and Lu but are twice-removed or further-removed in the order listed.

On the other hand, the difference between the atomic radii is large for Pr, Nd, and Sm. For these elements, clustering occurs easily even in the case where two elements adjacent in the order listed are used. However, the atomic radii of Pr, Nd, and Sm are large. Therefore, in the case where Pr, Nd, and Sm are used, decomposition occurs easily in the solution synthesis and/or in the film formation of the superconducting film. Therefore, it is undesirable to use Pr, Nd, or Sm as M2. As the element of M2, it is desirable to use Eu or an aftward element (i.e., Eu, Gd, Y, Tb, Dy, Ho, Er, Tm, Yb, and Lu). Although Y is not a lanthanoid, Y can be treated as substantially the size of Gd.

In the embodiment, a solution that satisfies the conditions recited above is used. A cluster is formed in which regions including M1 and regions including M3 are adjacent to each other. The clusters are formed in the interior of the oxide layer 50 by this phenomenon. For example, Sm is used as M1; and the Sm becomes non-superconducting by substituting Ba. For example, Pr is used as M1; and Ba is substituted for the Pr. Non-superconducting regions are obtained. In such a case, it is considered that, for example, the regions including M1 and the regions including M3 are arranged alternately in the cluster. It is considered that regions become non-superconducting in unit cells adjacent to each other as well. In the embodiment, an artificial pin of the appropriate size is obtained.

Clustering occurs for the regions including M1 and the regions including M3 due to a slight cell size difference. In the embodiment, for example, the decrease of impurities in the solution (the methanol solution) used when forming is indispensable [4]. When water or acetic acid exists excessively in the solution, for example, the growth interface is affected by the impurities. There are cases where good clustering is not obtained. The improvement effect of the magnetic field characteristics also is limited.

In the embodiment, multiple unit cells having different cell sizes are clustered in a perovskite structure. While a constant effect can be confirmed even for an artificial pin at the atomic level, a larger effect is obtained by the clustering. The embodiment realizes larger magnetic field characteristics by the clustering of artificial pins at the atomic level.

An example of a method for manufacturing the oxide superconductor 110 according to the embodiment will now be described.

FIG. 2A to FIG. 2D are schematic views illustrating the method for manufacturing the oxide superconductor according to the embodiment.

Figure 2A:
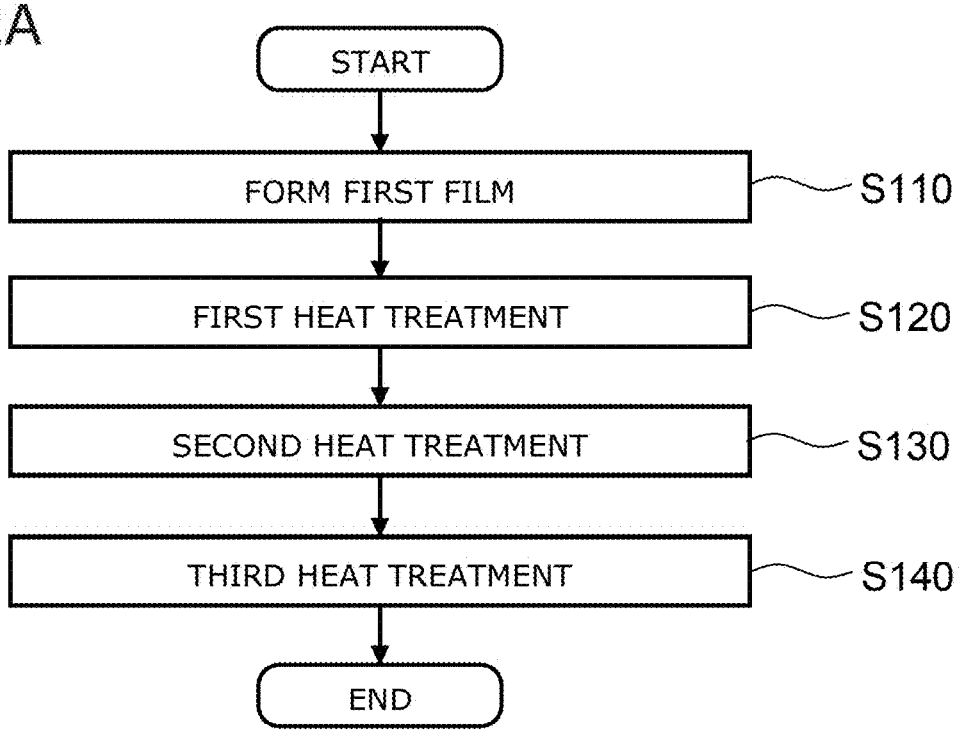
FIG. 2A to FIG. 2D are schematic views illustrating the method for manufacturing the oxide superconductor according to the embodiment.

FIG. 2A is a flowchart illustrating the method for manufacturing the oxide superconductor according to the embodiment.

Figure 2B:
Figure 2C:
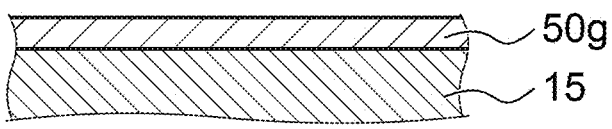
Figure 2D:

FIG. 2B to FIG. 2D are schematic cross-sectional views illustrating the method for manufacturing the oxide superconductor according to the embodiment.

As shown in FIG. 2A, the manufacturing method includes a first film formation process (step S110), a first heat treatment process (step S120), a second heat treatment process (step S130), and a third heat treatment process (step S140).

In the first film formation process as shown in FIG. 2B, a first film 50f is formed on the base member 15 by coating a solution onto the base member 15. The first film 50f includes at least a portion of the solution (a component included in the solution). The solution includes a first trifluoroacetate including the first element, a second trifluoroacetate including the second element, a third trifluoroacetate including the third element, and methanol.

The first element is one selected from a RE element group consisting of Pr, Nd, Sm, Eu, Gd, Y, Tb, Dy, Ho, Er, Tm, Yb, and Lu. The second element is one selected from any from the RE element group after the first element. The third element is one selected from any from the RE element group after the second element.

In the first heat treatment process as shown in FIG. 2C, a second film 50g is formed by performing heat treatment of the first film 50f at a first temperature. The second film 50g includes the first to third elements recited above and fluorine.

In the second heat treatment process as shown in FIG. 2D, a third film 50h is formed from the second film 50g by performing heat treatment of the second film 50g after the first heat treatment process recited above in an atmosphere including water at a second temperature that is higher than the first temperature.

Subsequently, in the third heat treatment process, the oxide layer 50 that has a perovskite structure having a number of oxygen atoms of 6.0 is formed from the third film 50h by performing heating of the third film 50h after the second heat treatment process in an atmosphere including oxygen.

Experiments performed by the inventor of the application will now be described.

Figure 3:
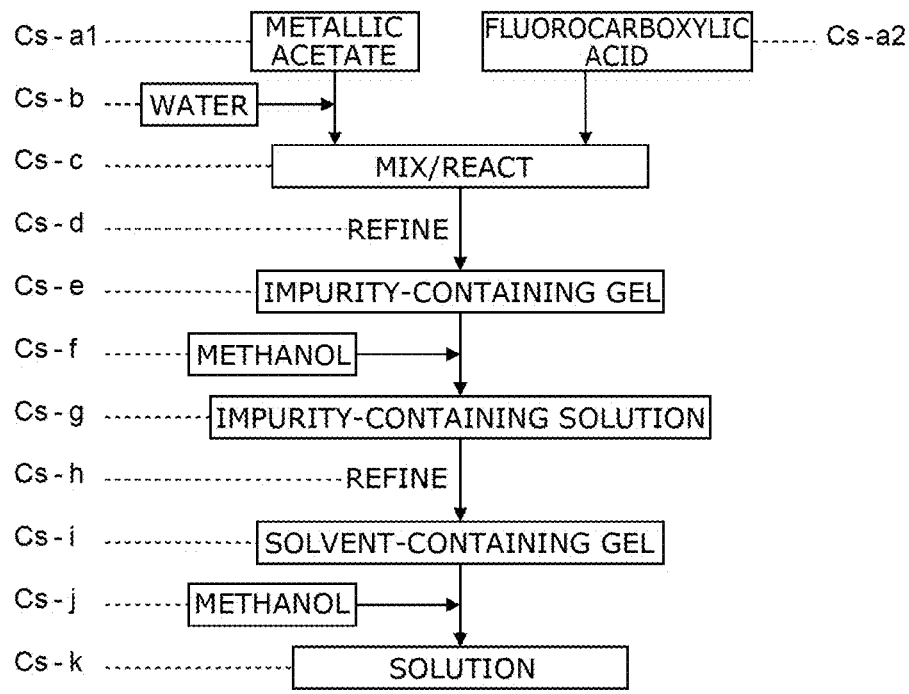
FIG. 3 is a flowchart illustrating the method for manufacturing the oxide superconductor according to the embodiment.
Figure 4:
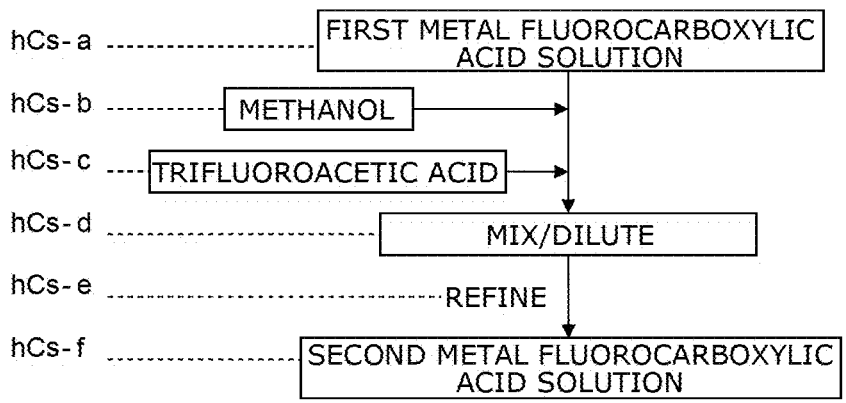
FIG. 4 is a flowchart illustrating the method for manufacturing the oxide superconductor according to the embodiment.
Figure 5:
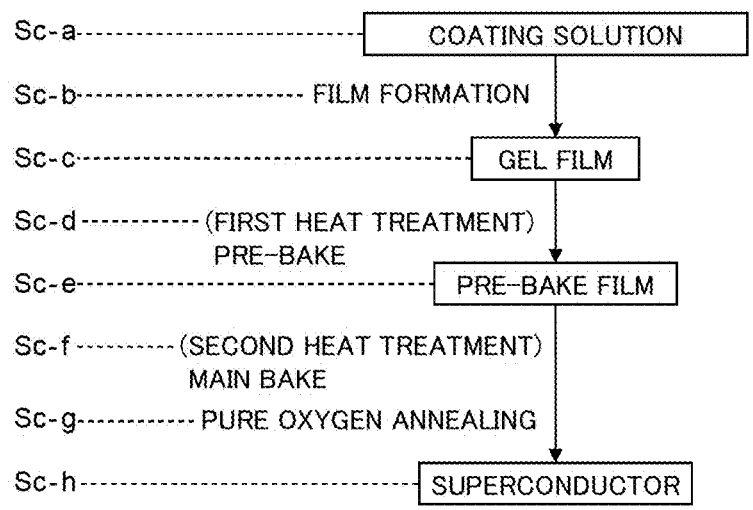
FIG. 5 is a flowchart illustrating the method for manufacturing the oxide superconductor according to the embodiment.

FIG. 3 to FIG. 5 are flowcharts illustrating the method for manufacturing the oxide superconductor according to the embodiment.

These figures are flowcharts according to the experiments as well.

FIG. 3 is a flowchart illustrating a preparation method of a coating solution.

FIG. 3 is a flowchart of the preparation of a coating solution or a semi-solution. In the case of a ReBCO (Re being Y or Eu to Lu) coating solution, the coating solution is obtained by mixing all of the metal species in the metallic acetate of FIG. 3 so that Re:Ba:Cu=1:2:3. Pentafluoropropionic acid is used as the fluorocarboxylic acid. Or, trifluoroacetic acid is used as the fluorocarboxylic acid.

FIG. 4 is a flowchart illustrating the method for manufacturing the solution used to form the oxide superconductor according to the embodiment.

FIG. 4 is a flowchart in which mainly trifluoroacetic acid is substituted for the fluorocarboxylic acid.

Multiple refinements are performed. In the initial refinement, the fluorocarboxylic acid in step hCs-a is only pentafluoropropionic acid. In the second refinement and subsequent refinements, the fluorocarboxylic acid in step hCs-a is a mixture of pentafluoropropionic acid and trifluoroacetic acid.

FIG. 5 is a flowchart illustrating the method for manufacturing the oxide superconductor.

FIG. 5 is a flowchart from the coating solution to when the superconductor is formed.

A gel film is obtained by coating the coating solution (step Sc-a). A first heat treatment (pre-bake, step Sc-d) and a second heat treatment (main bake, step Sc-f) are performed. Subsequently, for example, "pure oxygen annealing" (step Sc-g) processing is performed. Thereby, the superconductor is obtained. In the pure oxygen annealing, the concentration of the oxygen included in the atmosphere is, for example, not less than 10% and not more than 100%. In the embodiment, the concentration of the oxygen in the pure oxygen atmosphere is, for example, not less than 10% and not more than 100%.

Figure 6:
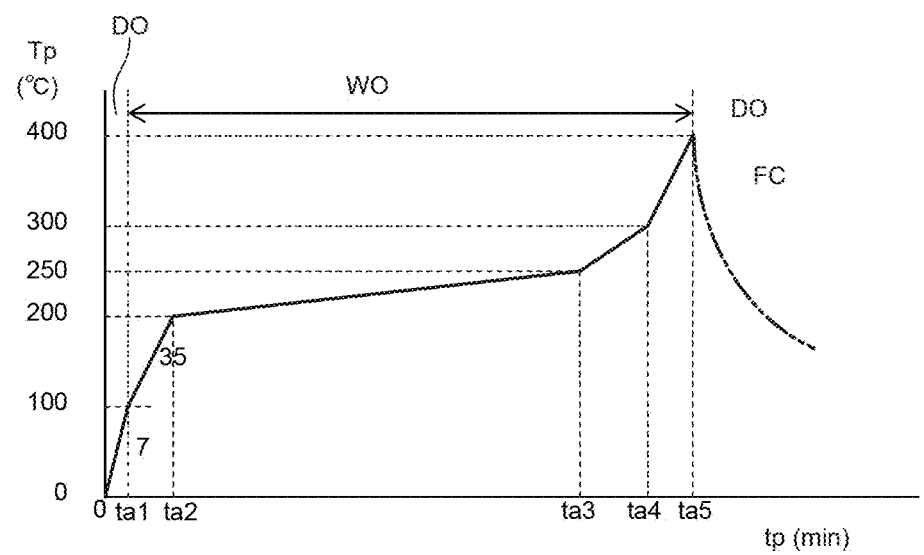
FIG. 6 is a schematic view illustrating the method for manufacturing the oxide superconductor according to the embodiment.
Figure 7:
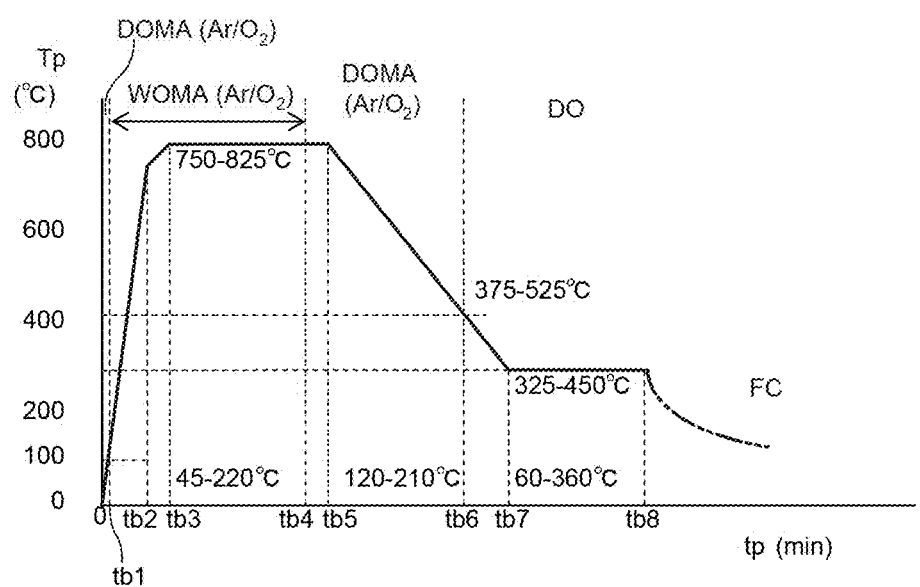
FIG. 7 is a schematic view illustrating the method for manufacturing the oxide superconductor according to the embodiment.

FIG. 6 and FIG. 7 are schematic views illustrating the method for manufacturing the oxide superconductor according to the embodiment.

FIG. 6 is a schematic view illustrating the first heat treatment.

FIG. 6 shows an example of the profile of the pre-bake illustrated in FIG. 3.

The horizontal axis of FIG. 6 is a time tp (minutes); and the vertical axis is a temperature Tp (degrees C.). The temperature is increased inside a dry oxygen atmosphere DO between time 0 to ta1. The temperature is increased inside a wet oxygen atmosphere WO between time ta1 to time ta5. At this time, the increase rate of the temperature is different between mutually-different intervals ta1 to ta2, ta2 to ta3, ta3 to ta4, and ta4 to ta5. Time ta1 is, for example, 7 minutes; and time ta2 is, for example, 35 minutes. The length may be modified between the intervals ta2 to ta3, ta3 to ta4, and ta4 to ta5. The temperature that corresponds to times ta2 to ta4 is a temperature range where a decomposition reaction occurs. There are many cases where the processing that corresponds to these intervals is the heat treatment having the longest time of the processing to be performed. Also, the interval can be shortened by setting the decomposition temperature to be high. FIG. 6 is an example of the decomposition heat treatment; and as long as the heat treatment corresponds to the heat treatment illustrated in FIG. 6, these intervals and temperatures may be modified. Furnace cooling FC is performed inside the dry oxygen atmosphere DO from time ta5.

FIG. 7 is a schematic view illustrating the second heat treatment.

FIG. 7 shows an example of the profile of the main bake illustrated in FIG. 3.

The horizontal axis of FIG. 7 is the time tp (minutes); and the vertical axis is the temperature Tp (degrees C.). The temperature is increased between time 0 to tb1 inside a dry Ar/$O_2$ atmosphere DOMA including Ar and $O_2$. Heat treatment is performed between time tb1 to time tb4 inside a wet Ar/$O_2$ atmosphere WOMA. The temperature is reduced between time tb4 to time tb6 inside the dry Ar/$O_2$ atmosphere DOMA. The furnace cooling FC is performed inside the dry oxygen atmosphere DO from time tb6.

Experimental examples relating to the superconductor will now be described.

First Experimental Example

A coating solution for a YBCO superconductor is synthesized and refined using the solution flowchart shown in the chart of FIG. 3. A powder of hydrates of each of Y(OCOCH$_3$)$_3$, Ba(OCOCH$_3$)$_2$, and Cu(OCOCH$_3$)$_2$ is used as the metallic acetate. These hydrates are dissolved in deionized water at a metal-ion mole ratio of Y:Ba:Cu=1:2:3. Mixing and stirring are performed with a stoichiometric quantity of CF$_3$COOH. The mixed solution that is obtained is placed in an eggplant-shaped flask; and reaction and refinement are performed for 12 hours inside a rotary evaporator at reduced pressure. A semi-transparent blue substance 1MAi (the substance Material A with impurity described in the first experimental example) is obtained. Water or acetic acid which is a reaction by-product of the solution synthesis is included in the semi-transparent blue substance 1MAi at about 7 wt %.

The substance 1MAi is added to methanol corresponding to a weight of about 100 times the substance 1MAi (Cs-f of FIG. 3) and is completely dissolved. The solution is placed in a rotary evaporator; and reaction and refinement are performed for 12 hours at reduced pressure. Thereby, a semi-transparent blue substance 1MA is obtained. The semi-transparent blue substance 1MA is dissolved inside methanol (Cs-j of FIG. 3) and is diluted using a volumetric flask. Thereby, a coating solution 1Cs-Y (first experimental example, Coating Solution for Y-based superconductor) is obtained. The metal ion concentration is 1.50×10$^{-3}$ mol/m$^3$.

The coating solution for the LuBCO superconductor is synthesized and refined using the solution flowchart shown in the chart of FIG. 3 by a method similar to that recited above. A powder of hydrates of each of Lu(OCOCH$_3$)$_3$, Ba(OCOCH$_3$)$_2$, and Cu(OCOCH$_3$)$_2$ is used as the metallic acetate. These hydrates are dissolved in deionized water having a metal-ion mole ratio of Lu:Ba:Cu=1:2:3. Mixing and stirring with a stoichiometric quantity of CF$_3$COOH is performed. The mixed solution that is obtained is placed in an eggplant-shaped flask; and reaction and refinement is performed for 12 hours inside a rotary evaporator at reduced pressure. Thereby, a semi-transparent blue substance 1MBi (the substance Material B with impurity described in the first experimental example) is obtained. Water or acetic acid which is a reaction by-product of the solution synthesis is included in the semi-transparent blue substance 1MBi at about 7 wt %.

The substance 1MBi is added to methanol corresponding to a weight of about 100 times the substance 1MBi (Cs-f of FIG. 3) and is completely dissolved. The solution is placed in a rotary evaporator; and reaction and refinement are performed for 12 hours at reduced pressure. Thereby, a semi-transparent blue substance 1MB is obtained. The semi-transparent blue substance 1MB is dissolved in methanol (Cs-j of FIG. 3) and diluted using a volumetric flask. Thereby, a coating solution 1Cs-Lu (first experimental example, Coating Solution for Lu-based superconductor) is obtained. The metal ion concentration is 1.50×10$^{-3}$ mol/m$^3$.

A coating solution for a DyBCO superconductor is synthesized and refined using the solution flowchart shown in the chart of FIG. 3 by a method similar to that recited above. A powder of hydrates of each of Dy(OCOCH$_3$)$_3$, Ba(OCOCH$_3$)$_2$, and Cu(OCOCH$_3$)$_2$ is used as the metallic acetate. These hydrates are dissolved in deionized water having a metal-ion mole ratio of Dy:Ba:Cu=1:2:3. Mixing and stirring with a stoichiometric quantity of CF$_3$COOH are performed. The mixed solution that is obtained is placed in an eggplant-shaped flask; and reaction and refinement are performed for 12 hours inside a rotary evaporator at reduced pressure. Thereby, a semi-transparent blue substance 1MCi (the substance Material C with impurity described in the first experimental example) is obtained. Water or acetic acid which is a reaction by-product of the solution synthesis is included in the semi-transparent blue substance 1MCi at about 7 wt %.

The substance 1MCi is added to methanol corresponding to a weight of about 100 times the substance 1MCi (Cs-f of FIG. 3) and is completely dissolved. The solution is placed in a rotary evaporator; and reaction and refinement are performed for 12 hours at reduced pressure. Thereby, the semi-transparent blue substance 1MCi is obtained. The semi-transparent blue substance 1MCi is dissolved in methanol (Cs-j of FIG. 3) and diluted using a volumetric flask. Thereby, a coating solution 1Cs-Dy (first experimental example, Coating Solution for Dy-based superconductor) is obtained. The metal ion concentration is $1.50\times10^{-3}$ mol/m$^3$.

Separately from that recited above, a semi-solution including Ba and Cu is synthesized and refined using the solution flowchart shown in the chart of FIG. 3. A powder of hydrates of each of Ba(OCOCH$_3$)$_2$ and Cu(OCOCH$_3$)$_2$ is used. These hydrates are dissolved in deionized water having a metal-ion mole ratio of Ba:Cu=2:3. Mixing and stirring with a stoichiometric quantity of CF$_3$COOH are performed. The mixed solution that is obtained is placed in an eggplant-shaped flask; and reaction and refinement are performed for 12 hours inside a rotary evaporator at reduced pressure. Thereby, a semi-transparent blue substance 1MDi is obtained. Water or acetic acid which is a reaction by-product of the solution synthesis is included in the semi-transparent blue substance 1MDi at about 7 wt %.

The substance 1MDi is added to methanol corresponding to a weight of about 100 times the substance 1MDi (Cs-f of FIG. 3) and is completely dissolved. The solution is placed in a rotary evaporator; and reaction and refinement are performed for 12 hours at reduced pressure. Thereby, a semi-transparent blue substance 1MD is obtained. The semi-transparent blue substance 1MD is dissolved in methanol (Cs-j of FIG. 3) and diluted using a volumetric flask. Thereby, a half coating solution 1hCs-BaCu (first experimental example, half coating Solution Ba and Cu) is obtained. The metal ion concentration is $1.50\times10^{-3}$ mol/m$^3$.

In addition to that recited above, a semi-solution that includes Sm is synthesized and refined using the solution flowchart shown in the chart of FIG. 3. A powder of a hydrate of Sm(OCOCH$_3$)$_3$ is dissolved in deionized water. Mixing and stirring with a stoichiometric quantity of CF$_3$CF$_2$COOH are performed. The mixed solution that is obtained is placed in an eggplant-shaped flask; and reaction and refinement are performed for 12 hours inside a rotary evaporator at reduced pressure. Thereby, a semi-transparent yellow substance 1MEi is obtained.

The substance 1MEi is added to methanol corresponding to a weight of about 100 times the substance 1MEi (Cs-f of FIG. 3) and is completely dissolved. The solution is placed in a rotary evaporator; and reaction and refinement are performed for 12 hours at reduced pressure. Thereby, a semi-transparent yellow substance 1ME is obtained. The semi-transparent yellow substance 1ME is dissolved in methanol (Cs-j of FIG. 3) and diluted using a volumetric flask. Thereby, a half coating solution 1hCs-Sm1 (first experimental example, Half coating Solution Sm step 1) is obtained. The metal ion concentration is $1.20\times10^{-3}$ mol/m$^3$.

TFA substitution of the PFP group is performed using the flowchart shown in FIG. 4 for the half coating solution 1hCs-Sm1. The half coating solution 1hCs-Sm1 is diluted 20 times by adding methanol; TFA corresponding to a stoichiometric quantity of PFP is added; and refinement is performed. Thereby, 1hCs-Sm2 (same as above, Step 2) is obtained. The half coating solution 1hCs-BaCu and the half coating solution 1hCs-Sm2 are mixed so that Sm:Ba:Cu=1: 2:3. Thereby, a coating solution 1Cs-Sm is obtained. The metal ion concentration of the coating solution is about $1.41\times10^{-3}$ mol/m$^3$.

1Cs-Y, 1Cs-Sm, and 1Cs-Lu are mixed so that the metal-ion mole ratio is 80:10:10. Thereby, a coating solution 1Cs-X1 (first experimental example, coating solution mixed 1) is obtained.

The film formation of the superconductor on a LaAlO$_3$ monocrystalline substrate is performed using the coating solution 1Cs-X1. The film formation is performed using spin coating at a maximum rotation speed of 4000 rpm. A pre-bake is performed in a pure oxygen atmosphere at 400 degrees C. or less using the profile shown in FIG. 6. A main bake is performed inside a 1000 ppm oxygen-mixed argon gas at 800 degrees C. using the profile shown in FIG. 7. Annealing is performed inside pure oxygen at 525 degrees C. or less. Thereby, a sample 1FS-X1 (first experimental example, Film of Superconductor, from mixed solution 1) of the superconducting film is obtained.

1Cs-Y, 1Cs-Lu, and 1Cs-Dy are mixed so that the metal-ion mole ratio is 80:10:10. A coating solution 1Cs-X2 (first experimental example, coating solution mixed 2) is obtained. The film formation of the superconductor on a LaAlO$_3$ monocrystalline substrate is performed by the method shown in FIG. 5 using the coating solution 1Cs-X2. Film formation is performed using spin coating at a maximum rotation speed of 4000 rpm. A pre-bake is performed in a pure oxygen atmosphere at 400 degrees C. or less using the profile shown in FIG. 6. A main bake is performed inside a 1000 ppm oxygen-mixed argon gas at 800 degrees C. using the profile shown in FIG. 7. Annealing is performed inside pure oxygen at 525 degrees C. or less. Thereby, a sample 1FS-X2 (first experimental example, Film of Superconductor, from mixed solution 2) of the superconducting film is obtained.

The film formation of the superconductor on a LaAlO$_3$ monocrystalline substrate is performed using the coating solutions 1Cs-Y and 1Cs-Lu by a method similar to that recited above. The film formation is performed using spin coating at a maximum rotation speed of 4000 rpm. A pre-bake is performed in a pure oxygen atmosphere at 400 degrees C. or less using the profile shown in FIG. 6. A main bake is performed inside a 1000 ppm oxygen-mixed argon gas at 800 degrees C. using the profile shown in FIG. 7. Annealing is performed inside pure oxygen at 525 degrees C. or less. Thereby, samples 1FS-Y (first experimental example, Film of Superconductor, Y-based) and 1FS-Lu (same as above, Lu-based) of the superconducting film are obtained.

Figure 8A:
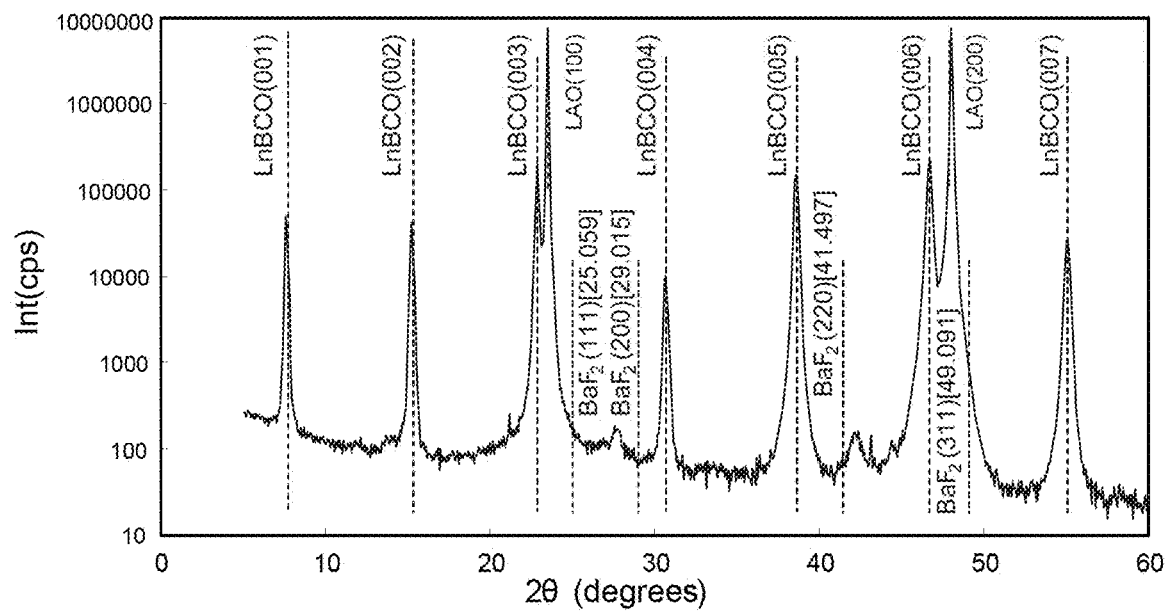
FIG. 8A and FIG. 8B are charts showing the analysis result of the oxide superconductor.
Figure 8B:
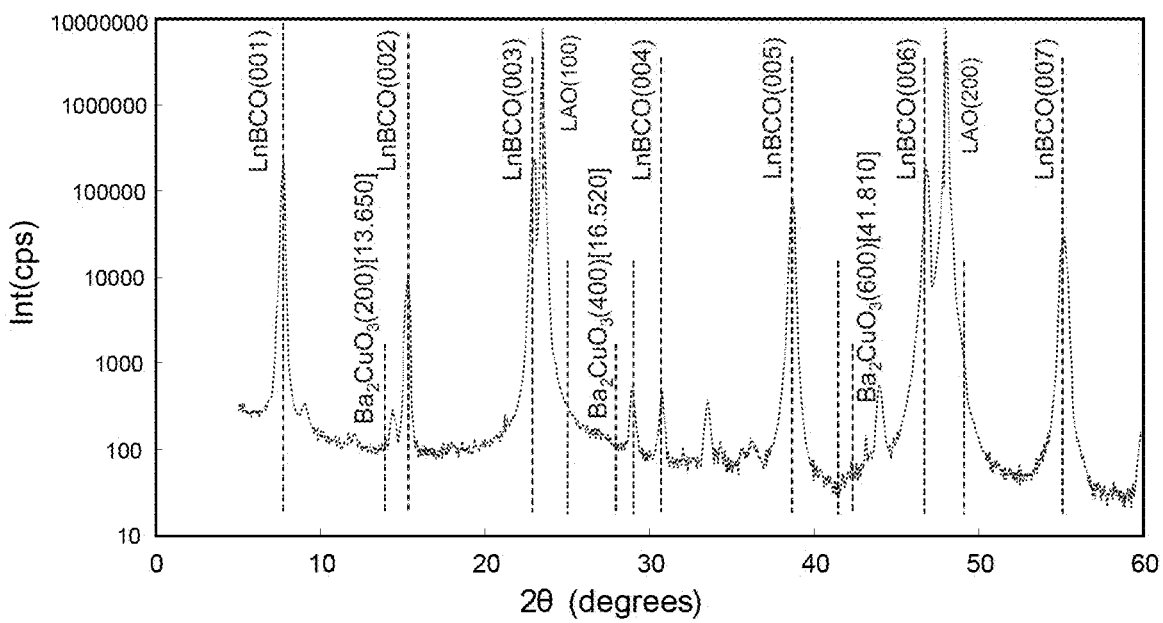

FIG. 8A and FIG. 8B are charts showing the analysis result of the oxide superconductor.

FIG. 8A corresponds to the sample 1FS-X1 (the sample of 80% YBCO+10% SmBCO+10% LuBCO). FIG. 8B corresponds to the sample 1FS-Lu (the sample of LuBCO). These figures show the measurement results of XRD (2θ/ω method). The horizontal axis is an angle 2θ. The vertical axis is a detection intensity Int (cps: counts per sec). The vertical axis is a logarithmic plot.

In the sample 1FS-X1 as shown in FIG. 8A, although peaks of Ba-Cu hybrid oxides having very small intensities are observed, the (00n) peaks of YBCO and the substrate peaks are the major peaks.

In the sample 1FS-Lu as shown in FIG. 8B, there is an unidentified peak at the angle 2θ at the vicinity of 33 degrees. Also, various unusual phases are confirmed.

In a superconductor having a perovskite structure, in the case where a lanthanoid element is positioned at a Y site, the appropriate partial pressure of oxygen in the main bake increases as the atomic number increases. In the case of a main bake at 800 degrees C., in the case where Nd, Sm, Gd, and Dy are positioned at the Y sites, it is considered that the appropriate partial pressure of oxygen in the main bake is in the vicinity of 5, 20, 200, and 1000 ppm for Nd, Sm, Gd, and Dy, respectively. Therefore, for Lu, it is considered that the appropriate partial pressure of oxygen is about 4000 ppm. The partial pressure of oxygen is 1000 ppm in the main bake of the first experiment. Therefore, as illustrated by the broken line of FIG. 8B, there is a possibility that an unusual phase corresponding to the angle 2θ of 33 degrees to 34 degrees is formed.

The unusual phase that is observed for the sample 1FS-Lu cannot be confirmed in the sample 1FS-X1 shown in FIG. 8A. In the case of SmBCO solitary heat treatment, the appropriate partial pressure of oxygen is about 20 ppm in the main bake at 800 degrees C. Therefore, the unusual phase formation is predicted. However, the unusual phase is not confirmed in the sample 1FS-X1 shown in FIG. 8A. For the sample 1S-X1, a result is obtained in which a single phase of YBCO is formed.

For comparison, XRD measurement results of the sample 1FS-Y which is a YBCO superconductor having good superconducting characteristics will be described.

Figure 9:
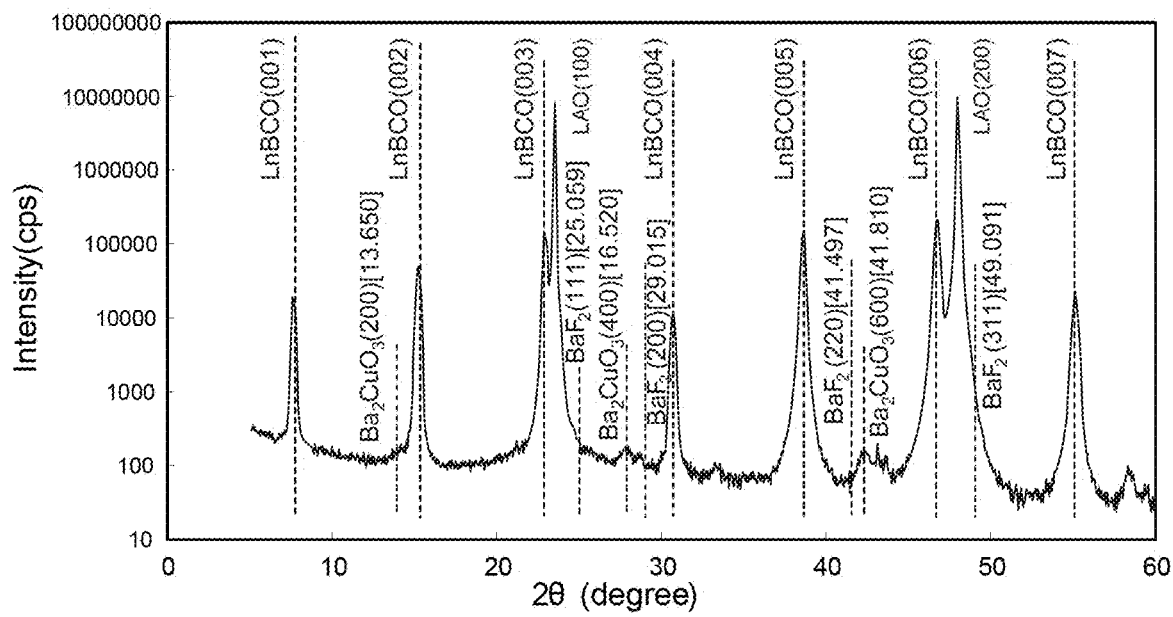
FIG. 9 is a chart of the analysis results of the oxide superconductor.

FIG. 9 is a chart of the analysis results of the oxide superconductor.

FIG. 9 shows the measurement results of XRD (2θ/ω) method) of YBCO.

In FIG. 9, an unusual phase substantially is not confirmed; and mainly the (00n) peaks of YBCO are observed. The Jc value for the sample is 6.5 MA/cm$^2$ @ (77K, 0 T. tesla). The sample is a superconductor having a substantially complete crystallized composition including a low angle grain boundary. For the sample, the intensities of the (003), (005), and (006) peaks which are characteristics of the YBCO peaks are relatively intense. Further, the intensity of the (001) peak is weaker than the (002) peak. This is a characteristic of YBCO. The intensity of the peak changes when another metal species is introduced to the Y site. For example, when Sm is introduced to the Y site, the peaks of (001), (003), and (006) become more intense. The change of the lattice constant obtained from XRD is slight for the perovskite structure obtained by mixing a small amount of SmBCO into YBCO. If a unit cell having a medium lattice constant is formed by the mixing, it is considered that the difference between the lattice constants is slight and the lattice constant changes continuously. When atoms, etc., exist in the diffraction path and obstruct the diffraction for the YBCO (00n) peaks, each of the YBCO (00n) peaks weakens; and a characteristic peak intensity distribution occurs. For example, for YBCO, the peaks of (003), (005), and (006) become more intense. When Sm is introduced instead of Y, the peaks of (001), (003), and (006) become more intense. The difference between the atomic radii of Y and Sm is slight. For a superconductor film in the mixed state of Y and Sm, the intensities of these peaks change continuously. Therefore, by clustering, in the case where the perovskite structure is formed by SmBCO and LuBCO coexisting inside YBCO, the intensities of these peaks should become medium intensities of the original peak intensities of these peaks.

In FIG. 8, the intensity of the (001) peak is near the intensity of the (002) peak. It is considered that this is because the intensity of the (001) peak changed in the direction of becoming more intense due to the effects of the Sm or the Lu. In the sample 1FS-X1, the lattice constant has Y as the base and is affected by Sm and Lu being mixed.

Results of high-resolution TEM (transmission electron microscope) observations of a sample including YBCO, SmBCO, and LuBCO will be described.

Figure 10:
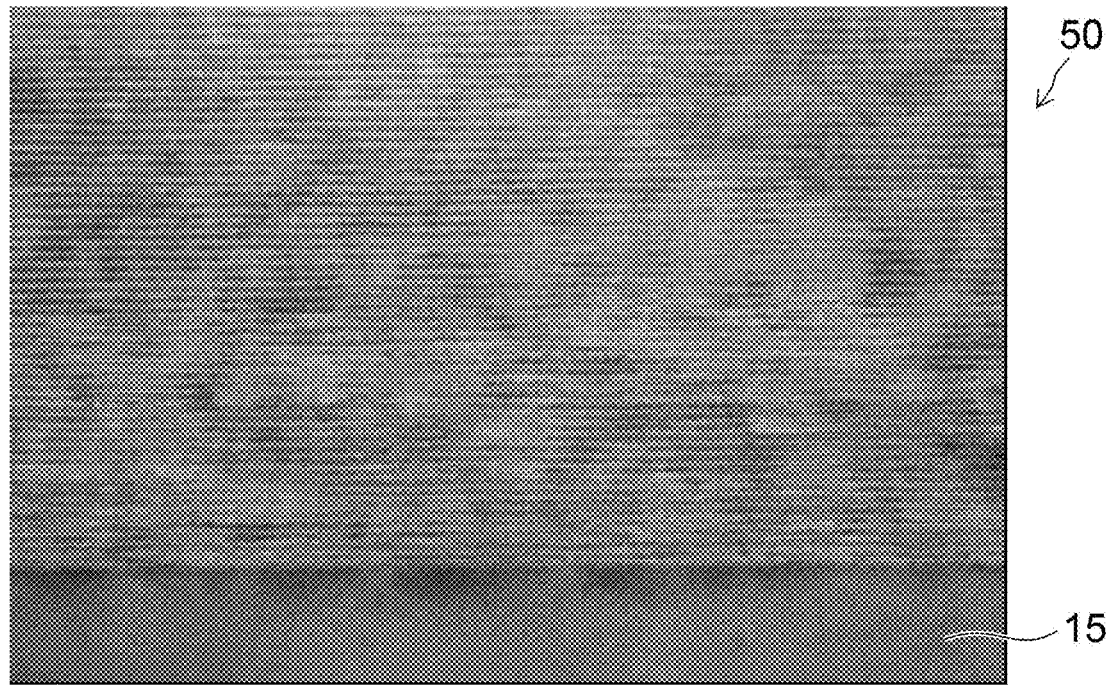
FIG. 10 is a transmission electron microscope image of the oxide superconductor.

FIG. 10 is a transmission electron microscope image of the oxide superconductor.

FIG. 10 is a cross section observation TEM image of a sample of 80% YBCO+10% SmBCO+10% LuBCO. The magnification is 2 million times.

From FIG. 10, a homogeneous structure that corresponds to a perovskite structure is confirmed in the entire field of view of the high-resolution TEM observation image at 2 million times. The lattice constant of the sample is considered to be single. Y, Sm, and Lu are detected in the EDS analysis. The lattice constant of the sample is near the lattice constant of YBCO. In the sample, it is considered that the crystal lattice distorts to match the lattice constant of the YBCO of 80%. The sample is considered to have a single perovskite structure.

In the embodiment, SmBCO and LuBCO segregate and aggregate. Clustering is caused to occur. The Sm and the Lu segregate in the clustering. For example, a method may be considered in which the arrangement of the Sm and the Lu is checked by EDS mapping measurements using high-resolution TEM. In this method, the thickness is about 50 nm even in the case where the sample is thin. Therefore, the average value of the sample in the thickness direction is detected. Therefore, for this method of checking by EDS mapping measurements using high-resolution TEM, it is difficult to evaluate the level of the clustering by a method that simply checks the amounts (the concentrations) of Sm and Lu.

In the sample of the experiment recited above, the Sm and the Lu form clusters; and the size of the clusters is estimated to be about 5 nm. The measurement region of the elements of the EDS map is, for example, 2 nm square. The minimum thickness in the depth direction is 50 nm due to the limit of the sample processing. In the EDS detection, the average value in the depth direction is calculated. If the cluster size is about 5 nm, a large difference is observed between the case where clusters exist inside the 5 nm square measurement field of view and the case where clusters do not exist. If the clusters exist, the Sm and the Lu change in conjunction.

The analysis results of an extreme dispersion sample (10% Sm+Y) will now be described. Clusters are not formed in the extreme dispersion sample.

Figures 11, 12, 13:
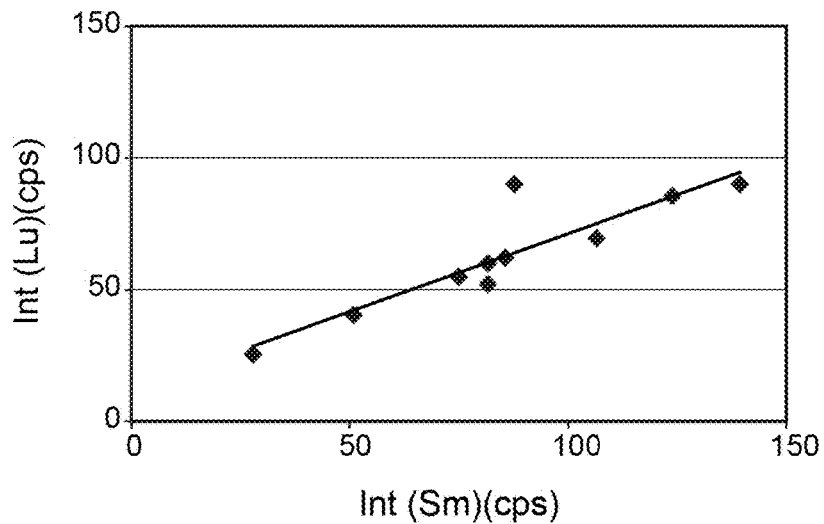
FIG. 11 is a table showing the analysis results of the oxide superconductor.
FIG. 12 is a table showing the analysis results of the oxide superconductor.
FIG. 13 is a graph showing the oxide superconductor.

FIG. 11 is a table showing the analysis results of the oxide superconductor.

FIG. 11 shows the concentration measurement results of cross section observation of the sample of 80% YBCO+10% SmBCO. The detection intensity Int of Sm for each of first to third observation regions AR1 to AR3 of the sample are shown.

For the first observation region AR1, the detection intensity Int of Sm by EDS is shown for each of six 5 nm square regions. A standard deviation σ of the six data is 1.31. The deviation index SD is defined based on the standard deviation σ. SD=σ/AV, where AV is the average of the six points of data. In the first observation region AR1 as shown in FIG. 11, the deviation index SD(Sm) that relates to Sm is 0.091. For the second observation region AR2, the detection results of Sm by EDS are shown for ten 5 nm square regions. For the third observation region AR3, the detection results of Sm by EDS are shown for eight 5 nm square regions. For the second observation region AR2, the deviation index SD(Sm) is 0.087. For the third observation region AR3, SD(Sm) is 0.076. Thus, in the extreme dispersion state, the deviation index SD is 0.076 to 0.091.

In FIG. 11, the fluctuation of the ten data of the second observation region AR2 appears to be small. A difference index Dmm (element name) is defined as a value indicating the difference between the maximum value and the minimum value. The difference index Dmm(element name) is (the maximum value of the detection intensity of the element)/(the minimum value of the detection intensity of the element). In the second observation region AR2, the difference index Dmm(Sm) is 1.27. This value is small. This value corresponds to the Sm being dispersed uniformly in the interior of the superconductor.

The EDS analysis results of the sample 1FS-X1 will now be described. It is considered that clustering occurs in the sample.

FIG. 12 is a table showing the analysis results of the oxide superconductor.

FIG. 12 is the concentration measurement results of the cross section observation of the sample 1FS-X1 (the sample of 80% YBCO+10% SmBCO+10% LuBCO). The analysis results of samples in which the concentrations of Sm are 12.5% to 17.5% also are listed in FIG. 12.

The Sm-La peak and the Ba-Lr peak overlap in the EDS measurement. Therefore, the concentration of Sm is calculated from the Sm-Lb peak. The peak intensity of Sm and the peak intensity of Lu are shown. These peak intensities change in conjunction with each other.

FIG. 13 is a graph showing the oxide superconductor.

FIG. 13 is a graph showing the interrelation (the clustering) of the segregation of Sm and Lu in the superconductor interior.

FIG. 13 shows EDS analysis of a sample FS-X. FIG. 13 shows the relationship between the concentration (the amount) of Sm and the concentration (the amount) of Lu. The horizontal axis of FIG. 13 is the detection intensity Int (Sm) (cps) of Sm. The vertical axis is the detection intensity Int (Lu) (cps) of Lu.

It can be seen from FIG. 13 that the Sm amount and the Lu amount change in conjunction with each other. In the sample, the deviation index SD(Sm) of Sm is 0.378. The Sm segregates with the Lu. For a 5 nm square observation region, the numerical value fluctuates greatly due to whether or not clusters are in the observation region. Therefore, it is considered that the deviation index SD(Sm) becomes large for this reason. The difference index Dmm(Sm) of the sample is large and is 5.02.

On the other hand, for Lu, the deviation index SD(Lu) is 0.339. The Lu segregates in conjunction with the Sm. It is considered that SD(Lu) becomes large for this reason. The difference index Dmm(Lu) is 3.52. The difference index Dmm(Lu) is extremely large. This value suggests segregation due to the clustering.

It is considered that the segregation recited above is evidence of clustering based on the difference between atomic radii. The results of EDS mapping measurements by the cross section TEM observation of the sample 1FS-X2 including Dy and Lu will now be described. The atomic size is smaller than the atomic size of Y for both Dy and Lu.

FIG. 14 is a table showing the analysis results of the oxide superconductor.

FIG. 14 shows the concentration measurement results of Dy and Lu by cross section observation of the sample 1FS-X2 (the sample of 80% YBCO+10% DyBCO+10% LuBCO). FIG. 14 is the results of the EDS measurement focusing on the concentration of Dy and the Lu concentration. The results of the EDS measurement of fourth to sixth observation regions AR4 to AR6 at three locations in ten measurement regions (having a size of 5 nm square) are shown in FIG. 14.

It can be seen from FIG. 14 that the concentration (the detection intensity Int) of Dy and the concentration (the detection intensity Int) of Lu substantially do not change in the multiple measurement regions.

As shown in FIG. 14, the deviation index SD(Dy) that relates to Dy is 0.059 to 0.087. The deviation index SD(Lu) that relates to Lu is 0.071 to 0.090. The difference index Dmm(Dy) that relates to Dy is 1.22 to 1.28. The difference index Dmm(Lu) that relates to Lu is 1.19 to 1.29. These results are near the results of FIG. 11. Although the atomic radius of Dy is different from the atomic radius of Lu, both are smaller than the atomic radius of Y. It is considered that the probability of a small unit cell growing adjacent to a small unit cell is low. It is considered that clustering did not occur in the sample for this reason.

An example of a cluster formation model will now be described. For example, the clustering occurs by the existence of multiple unit cells having mutually-different lattice constants.

FIG. 15A to FIG. 15F are schematic views showing unit cells of the oxide superconductor.

FIG. 15A and FIG. 15B correspond to the unit cell of YBCO. FIG. 15C and FIG. 15D correspond to the unit cell of SmBCO. FIG. 15E and FIG. 15F correspond to the unit cell of LuBCO. FIG. 15B, FIG. 15D, and FIG. 15F are schematic views as viewed from one direction (e.g., the Z-axis direction). FIG. 15A, FIG. 15C, and FIG. 15E are schematic views as viewed from a direction perpendicular to the one direction (e.g., a direction along the X-Y plane). These drawings illustrate the unit cell sizes used when clustering.

In the example, SmBCO and LuBCO are mixed inside YBCO; and clustering occurs. The unit cell of YBCO is used as the parent phase. The size of the unit cell of SmBCO is larger than the size of the unit cell of YBCO. The cell size of LuBCO is smaller than the size of the unit cell of YBCO. In the sample, the proportion of the YBCO in the entirety is high. Therefore, it is considered that the crystal grows to the size of YBCO from nuclear generation to the growth. The clustering proceeds in such a configuration. An example of the clustering will now be described.

FIG. 16A to FIG. 16F are schematic views illustrating formation processes of the oxide superconductor.

In these figures, Sm corresponds to M1 recited above. Y corresponds to M2 recited above. Lu corresponds to M3 recited above. In the example, clustering that includes the M1 element and the M3 element is formed in the a/b plane.

Figure 16A:
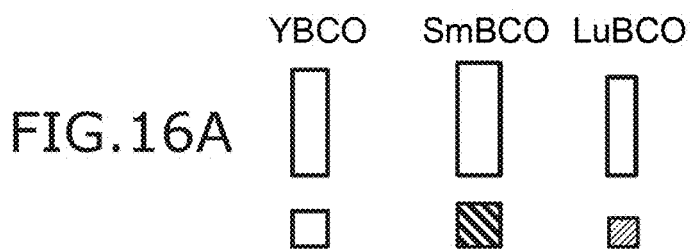
FIG. 16A to FIG. 16F are schematic views illustrating formation processes of the oxide superconductor.

As shown in FIG. 16A, the cell size of SmBCO is larger than the cell size of YBCO. The cell size of LuBCO is smaller than the cell size of YBCO.

Figure 16B:
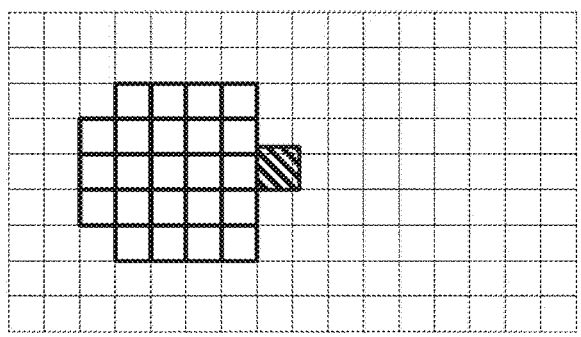

As shown in FIG. 16B, for example, SmBCO that has the large size grows adjacent to the YBCO unit cell. For the SmBCO unit cell, there are no constraints from above and below or the right side in the figure. In such a case, the SmBCO unit cell is slightly larger.

Figure 16C:
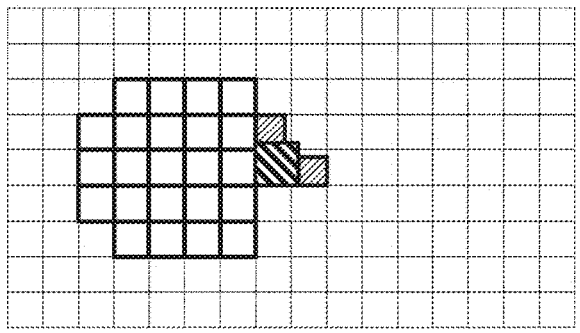

As shown in FIG. 16C, LuBCO that has a small cell size grows easily at positions adjacent to the SmBCO unit cell. This is due to effects of the foundation. In the case where the cell size of the region including one LuBCO and one SmBCO is twice that of the YBCO, the YBCO does not always grow easily. It is considered that the SmBCO grows easily in the depth direction of the cluster.

Figure 16D:
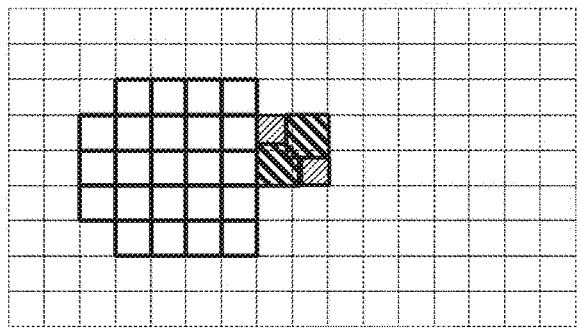

Therefore, as shown in FIG. 16D, an aggregate of Sm and Lu is formed.

Figure 16E:
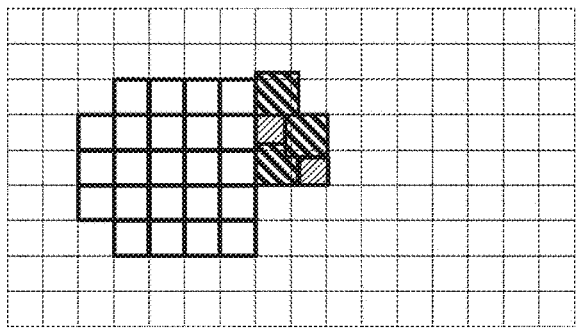

As shown in FIG. 16E, the SmBCO that is adjacent to the LuBCO grows easily. Such a process is repeated.

Figure 16F:
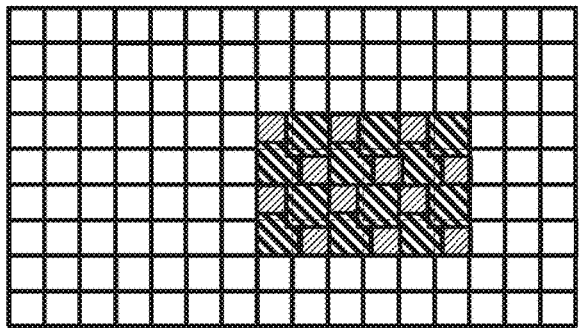

Thus, the clusters grow as shown in FIG. 16F. It is considered that the sizes of the clusters are determined by the existence amount of SmBCO and LuBCO. The YBCO grows when Sm and Lu are not supplied.

FIG. 17A and FIG. 17B are schematic views showing configurations of the superconductor.

As shown in these figures, the clusters grow while the lattice distorts; and a perovskite structure as an entirety is formed. As shown in FIG. 17A, the clustering region is formed inside the YBCO. In FIG. 17A, the size of the SmBCO is shown as being larger than the size of the YBCO; and the size of the LuBCO is shown as being smaller than the size of the YBCO. There is distortion in the lattice in this state; and this state is unstable. A state that matches the lattice constant is stable energetically.

Therefore, as shown in FIG. 17B, after the growth, the size of the SmBCO, the size of the LuBCO, and the size of the YBCO become the same size. Thereby, a substantially single perovskite structure is obtained. In this structure, the perovskite structure is maintained while containing SmBCO and LuBCO. Inside the structure in which the perovskite structure is maintained, the SmBCO is smaller than the original lattice size; the LuBCO is larger than the original lattice size; and the lattice size is the lattice size of YBCO. At this time, the direction of the c-axis is substantially the same between the YBCO, the SmBCO, and the LuBCO. Therefore, the (006) peak which is the most intense peak is observed as one peak in the XRD measurement.

In a superconductor that includes clusters, for example, the Jc-B characteristics improve when one of the clusters becomes an artificial pin.

FIG. 18 is a graph showing characteristics of the oxide superconductor.

FIG. 18 shows an example of the Jc-B measurement results of the sample.

FIG. 18 shows the measurement results of a sample SPL01, a sample SPL02, and a sample SPL03. The sample SPL01 includes 10% Sm, 10% Lu, and 80% YBCO. The sample SPL02 includes 10% Sm and 90% YBCO. The sample SPL03 includes 30% Sm and 70% YBCO. The horizontal axis of FIG. 18 is a magnetic field B (T: tesla). The vertical axis is a critical current Ic (A: ampere).

In the sample SPL01 as shown in FIG. 18, the critical current Ic is high. For example, when the magnetic field B is 0.9 T, the critical current Ic of the sample SP01 is 1.81 times the critical currents Ic of the sample SPL02 and the sample SPL03.

The samples SPL02 and SPL03 that include Sm but do not include Lu are in an extreme dispersion state. The effect as an artificial pin is not realized in these samples. Clusters exist in the sample SPL01 that includes Sm and Lu. Sm segregates. Therefore, Ba substitution occurs; and sites that are used as artificial pins exist concentratively. Thereby, the effect as an artificial pin is realized.

Second Experimental Example

In the solution flowchart shown in the chart of FIG. 3, a coating solution for a YBCO superconductor is synthesized and refined. A powder of hydrates of each of $Y(OCOCH_3)_3$, $Ba(OCOCH_3)_2$, and $Cu(OCOCH_3)_2$ is used as the metallic acetate. These hydrates are dissolved in deionized water at a metal-ion mole ratio of Y:Ba:Cu=1:2:3. Mixing and stirring with a stoichiometric quantity of $CF_3COOH$ are performed. The mixed solution that is obtained is placed in an eggplant-shaped flask; and reaction and refinement is performed for 12 hours inside a rotary evaporator at reduced pressure. Thereby, a semi-transparent blue substance 2MAi (the substance Material A with impurity described in the second experimental example) is obtained. Water or acetic acid which is a reaction by-product of the solution synthesis is included in the semi-transparent blue substance 2MAi at about 7 wt %.

The substance 2MAi is added to methanol corresponding to a weight of about 100 times the substance 2MAi (Cs-f of FIG. 3) and is completely dissolved. The solution is placed in a rotary evaporator; and reaction and refinement are performed for 12 hours at reduced pressure. Thereby, a semi-transparent blue substance 2MA is obtained. The semi-transparent blue substance 2MA is dissolved in methanol (Cs-j of FIG. 3) and diluted using a volumetric flask. Thereby, a coating solution 2Cs-Y (second experimental example, Coating Solution for Y-based superconductor) is obtained. The metal ion concentration $1.50 \times 10^{-3}$ mol/m$^3$.

A coating solution for a LuBCO superconductor is synthesized and refined using the solution flowchart shown in the chart of FIG. 3. A powder of hydrates of $Lu(OCOCH_3)_3$, $Ba(OCOCH_3)_2$, and $Cu(OCOCH_3)_2$ is used as the metallic acetate. These hydrates are dissolved in deionized water having a metal-ion mole ratio of Lu:Ba:Cu=1:2:3. Mixing and stirring with a stoichiometric quantity of $CF_3COOH$ is performed. The mixed solution that is obtained is placed in an eggplant-shaped flask; and reaction and refinement are performed for 12 hours inside a rotary evaporator at reduced pressure. Thereby, a semi-transparent blue substance 2MBi (the substance Material B with impurity described in the second experimental example) is obtained. Water and/or acetic acid which is a reaction by-product of the solution synthesis is included in the semi-transparent blue substance 2MBi at about 7 wt %.

The substance 2MBi is added to methanol corresponding to a weight of about 100 times the substance 2MBi (Cs-f of FIG. 3) and is completely dissolved. The solution is placed in a rotary evaporator; and reaction and refinement are performed for 12 hours at reduced pressure. Thereby, a semi-transparent blue substance 2MB is obtained. The semi-transparent blue substance 2MB is dissolved in methanol (Cs-j of FIG. 3) and diluted using a volumetric flask. Thereby, a coating solution 2Cs-Lu (second experimental example, Coating Solution for Lu-based superconductor) is obtained. The metal ion concentration is $1.50 \times 10^{-3}$ mol/m$^3$.

A semi-solution that includes Ba and Cu is synthesized and refined using the solution flowchart shown in the chart of FIG. 3. A powder of hydrates of each of $Ba(OCOCH_3)_2$ and $Cu(OCOCH_3)_2$ is used. These hydrates are dissolved in deionized water at a metal-ion mole ratio of Ba:Cu=2:3. Mixing and stirring with a stoichiometric quantity of $CF_3COOH$ are performed. The mixed solution that is obtained is placed in an eggplant-shaped flask; and reaction and refinement are performed for 12 hours inside a rotary evaporator at reduced pressure. Thereby, a semi-transparent blue substance 2MDi is obtained. Water or acetic acid which is a reaction by-product of the solution synthesis is included in the semi-transparent blue substance 2MDi at about 7 wt %.

A substance 2MCi is added to methanol corresponding to a weight of about 100 times the substance 2MCi (Cs-f of FIG. 3) and is completely dissolved. The solution is placed in a rotary evaporator; and reaction and refinement are performed for 12 hours at reduced pressure. Thereby, a semi-transparent blue substance 2MC is obtained. The semi-transparent blue substance 2MC is dissolved in methanol (Cs-j of FIG. 3) and diluted using a volumetric flask. Thereby, a half coating solution 2hCs-BaCu (second experimental example, half coating Solution Ba and Cu) is obtained. The metal ion concentration is $1.50 \times 10^{-3}$ mol/m$^3$.

A semi-solution that includes Sm is synthesized and refined using the solution flowchart shown in the chart of FIG. 3. A powder of a hydrate of $Sm(OCOCH_3)_3$ is dissolved in deionized water. Mixing and stirring with a stoichiometric quantity of $CF_3CF_2COOH$ are performed. The mixed solution that is obtained is placed inside an eggplant-shaped flask; and reaction and refinement are performed for 12 hours inside a rotary evaporator at reduced pressure. Thereby, a semi-transparent yellow substance 2MEi is obtained.

The substance 2MDi is added to methanol corresponding to a weight of about 100 times the substance 2MDi (Cs-f of FIG. 3) and is completely dissolved. The solution is placed in a rotary evaporator; and reaction and refinement are performed for 12 hours at reduced pressure. Thereby, a semi-transparent yellow substance 2MD is obtained. The semi-transparent yellow substance 2MD is dissolved in methanol (Cs-j of FIG. 3) and diluted using a volumetric flask. Thereby, a half coating solution 2hCs-Sm1 (second experimental example, Half coating Solution Sm step 1) is obtained. The metal ion concentration is $1.20 \times 10^{-3}$ mol/m$^3$.

TFA substitution of the PFP group of the half coating solution 2hCs-Sm1 is performed using the flowchart shown in FIG. 4. The half coating solution 2hCs-Sm1 is diluted 20 times by adding methanol; TFA corresponding to a stoichiometric quantity of PFP is added; and refinement is performed. Thereby, a half coating solution 2hCs-Sm2 (same as above, Step 2) is obtained.

The half coating solution 2hCs-BaCu and the half coating solution 2hCs-Sm2 are mixed so that Sm:Ba:Cu=1:2:3. Thereby, a coating solution 2Cs-Sm is obtained. The metal ion concentration of the coating solution is about $1.41 \times 10^{-3}$ mol/m$^3$.

The solution 2Cs-Y, the solution 2Cs-Sm, and the solution 2Cs-Lu are mixed. At this time, the mixing ratio is modified. Thereby, the four types of a coating solution 2Cs-X1 (second experimental example, coating solution mixed 1), a coating solution 2Cs-X2, a coating solution 2Cs-X3, and a coating solution 2Cs-X4 are obtained. The metal-ion mole ratios of the coating solutions are (Y:Sm:Lu) equal to 80:12.5:7.5, 80:15:5, 80:17.5:2.5, and 80:20:0, respectively.

Film formation of a superconductor on a $LaAlO_3$ monocrystalline substrate is performed using the coating solution 2Cs-X1, 2Cs-X2, 2Cs-X3, and 2Cs-X4. The film formation is performed at a maximum rotation speed of 4000 rpm using spin coating. A pre-bake is performed in a pure oxygen atmosphere at 400 degrees C. or less using the profile shown in FIG. 6. A main bake is performed inside an oxygen-mixed argon gas of 1000 ppm at 800 degrees C. using the profile shown in FIG. 7. Annealing is performed inside a pure oxygen at 525 degrees C. or less. Thereby, samples 2FS-X1 (second experimental example, Film of Superconductor, from mixed solution 1), 2FS-X2, 2Fs-X3, and 2FS-X4 of the superconducting film are obtained.

Figure 19:
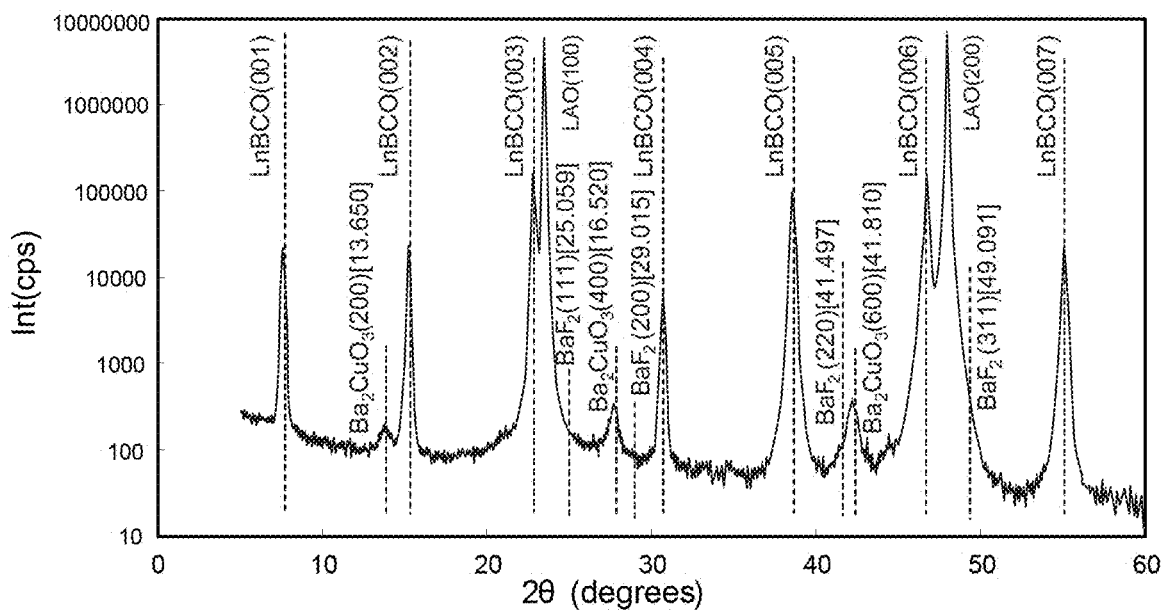
FIG. 19 is a chart showing analysis results of the oxide superconductor.

FIG. 19 is a chart showing analysis results of the oxide superconductor.

FIG. 19 shows XRD (2θ/ω) method) measurement results of the sample 2FS-X2. The horizontal axis is the angle 2θ (degrees). The vertical axis is the detection intensity Int (cps, logarithmic plot). For the sample 2FS-X2, although a peak of the B-Cu hybrid oxide having a small intensity is observed, the (00n) peaks of YBCO and the substrate peaks are the major peaks. The YBCO (00n) peaks are intense. The sample has a single perovskite structure. It is considered that clusters are formed when the concentrations of Sm and Lu are 5%. The peak intensities that indicate cluster formation are large.

Figure 20:
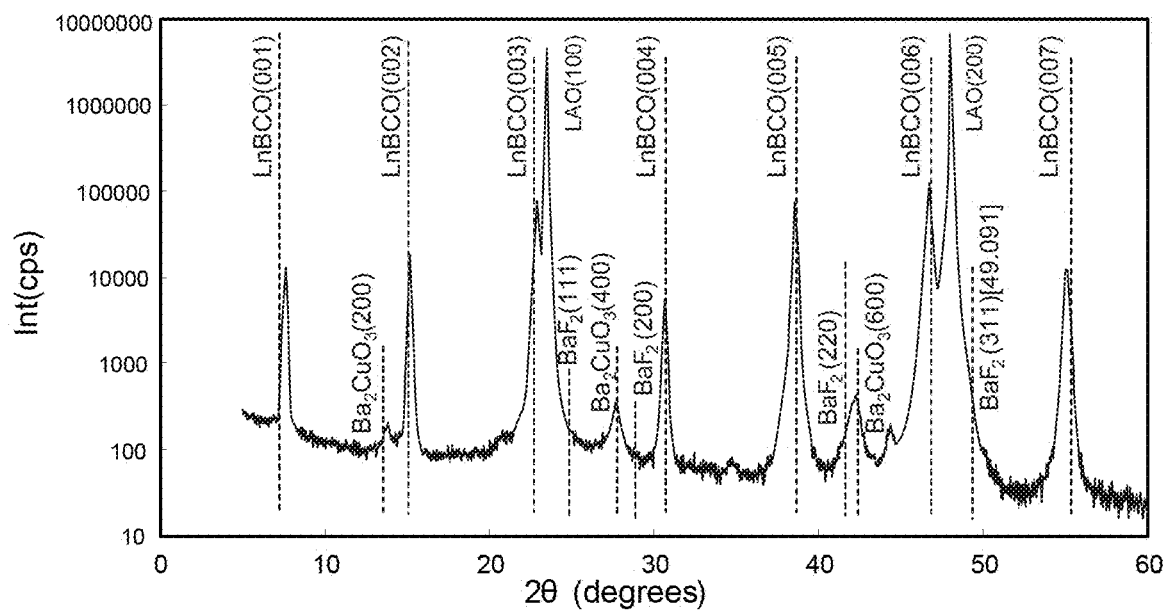
FIG. 20 is a chart showing analysis results of the oxide superconductor.

FIG. 20 is a chart showing analysis results of the oxide superconductor.

FIG. 20 shows measurement results of XRD measurements (2θ/ω method) of the sample 2FS-X4. The horizontal axis is the angle 2θ (degrees). The vertical axis is the detection intensity Int (cps, logarithmic plot). For the sample 2FS-X4 as shown in FIG. 20, compared the sample 2FS-X2, the intensities of the YBCO (00n) peaks are weak. For a sample FS-X4, compared to the YBCO peaks, the relative unusual phase intensity of Ba-Cu is intense. The state of the sample corresponds to extreme dispersion. In extreme dispersion, the YBCO peak intensity decreases.

Figure 21:
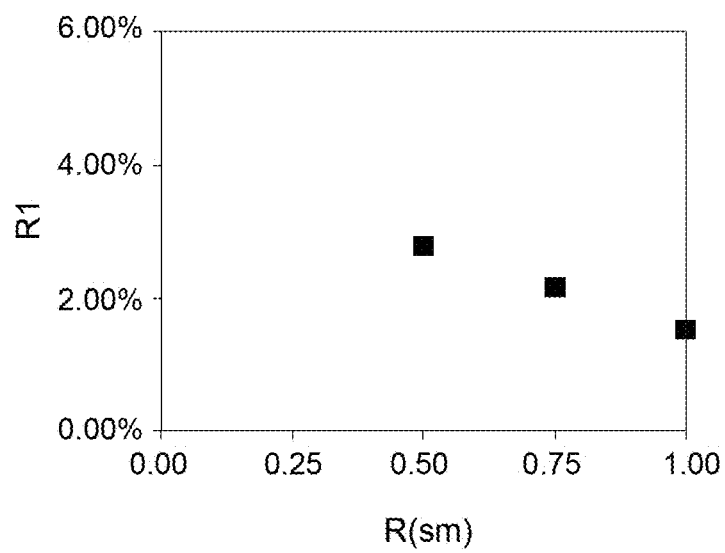
FIG. 21 is a graph showing a characteristic of the oxide superconductor.

FIG. 21 is a graph showing a characteristic of the oxide superconductor.

FIG. 21 shows the relationship between the Sm amount and the intensity of the YBCO (005) peak. The result of the sample 1FS-X1 described in reference to the first experiment also is displayed in FIG. 21. The horizontal axis of FIG. 21 is the proportion R(Sm) of Sm. The proportion R(Sm) of Sm is the ratio of the amount of Sm to the total amount of Sm and Lu. The vertical axis is a relative ratio R1 of the YBCO (00) peak intensity. The relative ratio R1 is the ratio of the intensity of the YBCO (005) peak to the intensity of the LAO (200) peak.

As shown in FIG. 21, the relative ratio R1 is large when the proportion R(Sm) of Sm is 0.5. The YBCO intensity increases as the ratio between Sm and Lu becomes 1:1. In the superconductor, YBCO is the main material. The internal stress, etc., are relaxed by the existence of SmBCO and LuBCO which have sizes different from the size of YBCO. This has an advantageous effect on unusual phase formation. On the other hand, when the proportion R(Sm) of Sm is 1, the relative ratio R1 of the intensity of the YBCO (005) peak is low. The sample corresponds to extreme dispersion and corresponds to the sample of 20% Sm+80% Y (the sample of 100% Sm). In the sample, the Sm of the amount of 20% has extreme dispersion; and the lattice distorts. Diffraction in YBCO (00) having the large surface index is difficult. It is considered that the intensity of the peak is weaker for this reason.

Figure 22:
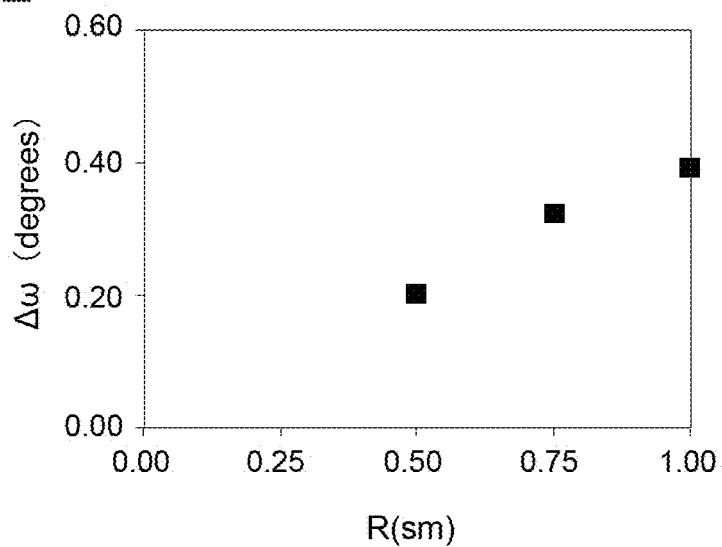
FIG. 22 is a graph showing a characteristic of the oxide superconductor.

FIG. 22 is a graph showing a characteristic of the oxide superconductor.

FIG. 22 shows the correlation between the Sm amount and Δω corresponding to the off-surface orientation for the sample recited above.

When Δω is small, the fluctuation is small. Δω being small corresponds to a monocrystalline configuration of good quality. The horizontal axis is the proportion R(Sm) of Sm. The vertical axis is Δω.

Δω is small when the proportion R(Sm) of Sm is 0.5 (when the ratio between Sm and Lu is 1:1). Good results are obtained when the ratio of SmBCO having a large unit cell size and LuBCO having a small unit cell size is 1:1.

By cross section TEM observation of the sample 2FS-X2 in which the Sm amount is 15%, it can be recognized that the superconductor has a good perovskite structure.

Differences of Δω, etc., are difficult to discriminate. Clustering occurs in the case of a superconductor having a good single perovskite structure. It can be estimated simply that clustering has occurred if Δω is equal to or narrower than that of the solitary YBCO intensity in the XRD Rocking curve.

Figure 23:
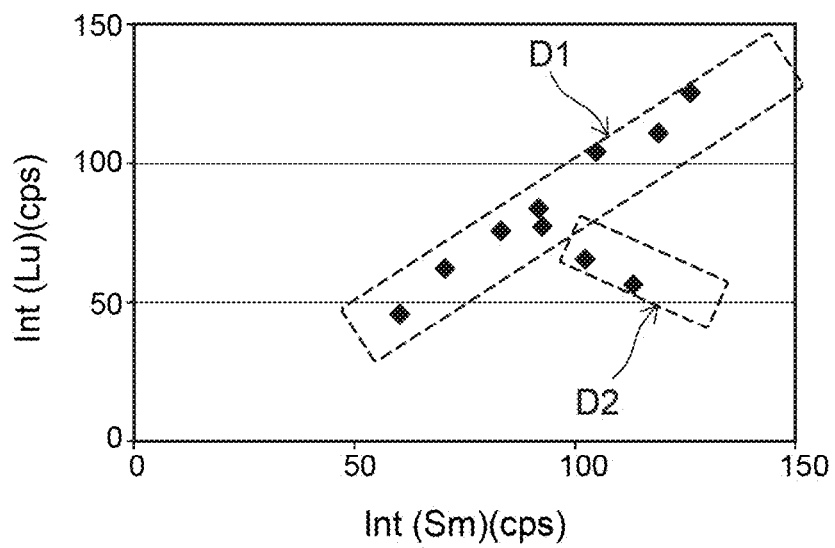
FIG. 23 is a graph showing a characteristic of the oxide superconductor.
Figure 24:
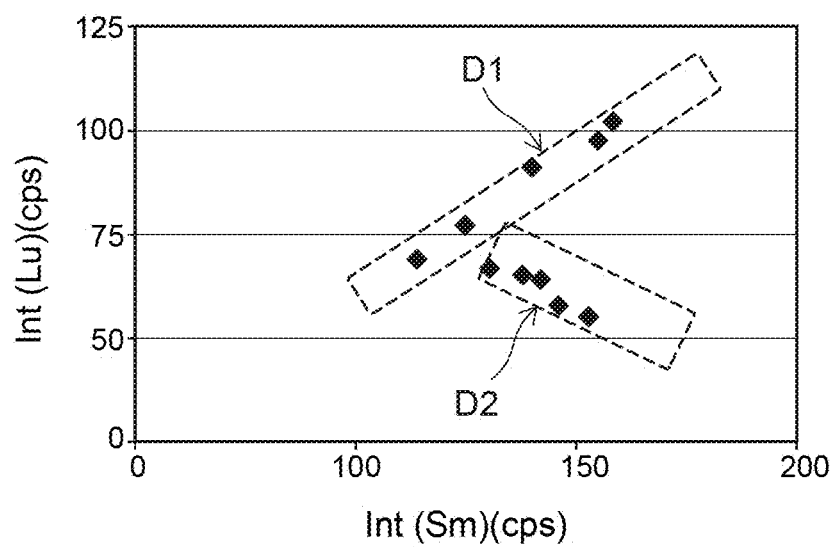
FIG. 24 is a graph showing a characteristic of the oxide superconductor.
Figure 25:
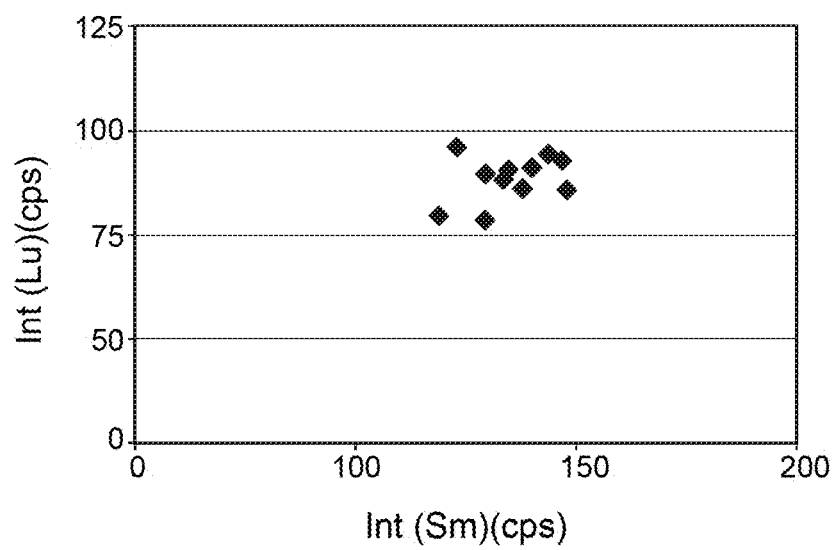
FIG. 25 is a graph showing a characteristic of the oxide superconductor.

FIG. 23 to FIG. 25 are graphs showing characteristics of the oxide superconductor.

FIG. 23 corresponds to a sample 2Fs-X1. FIG. 24 corresponds to a sample 2Fs-X2. FIG. 25 corresponds to the sample 2Fs-X3. These figures show the results of performing high-resolution TEM observation of the samples, performing EDS analysis, and determining the correlation between the Sm amount (the concentration) and the Lu amount (the concentration). In these figures, the horizontal axis is the detection intensity Int (Sm) of Sm. The vertical axis is the detection intensity Int (Lu) of Lu.

As shown in FIG. 23, the concentration of Lu is interrelated with the concentration of Sm for many plots. The interrelation of a first data group D1 shown in FIG. 23 is shown. For the sample corresponding to the first data group, the concentration of Sm is 12.5%; and the concentration of Lu is 7.5%. When Sm and Lu form clusters, 7.5% of Sm and 7.5% of Lu form clusters. The total of Sm and Lu is 20%. Clustering occurs for the amount of 15% which is the total of 7.5% of Sm and 7.5% of Lu. At this time, 75% of the metallic element of the introduced amount (20%) relates to the formation of the clusters.

In the sample, a small amount of Lu segregates due to the clustering. For the Sm, a clustering portion and a portion of extreme dispersion coexist. A second data group D2 shown in FIG. 23 corresponds to the coexistence. Almost all of the Lu forms clusters with the Sm. Compared to the extreme dispersion state, the Lu segregates. A portion of the data shown in FIG. 23 corresponds to the sample 2FS-X1 shown in FIG. 12.

For the data of FIG. 23, the deviation index SD(Sm) is 0.219. The deviation index SD(Lu) is large and is 0.330. It is considered that this is affected by the segregating due to the clustering. The difference index Dmm(Sm) is 2.11; but the difference index Dmm(Lu) is 2.77. When two elements (Sm and Lu) having different amounts (concentrations) are introduced, the state of the clusters is known by focusing on the element of the smaller amount.

FIG. 24 corresponds to the sample 2Fs-X2 (the sample including 15% Sm and 5% Lu). For the sample, there are few data inside the first data group D1 indicating clustering. The data inside the second data group D2 has increased. It is considered that the data inside the second data group D2 is affected by the excess Sm. It is considered that 5% of Sm and 5% of Lu have clustered. The 50% of the introduced amount of Sm and Lu clusters. It is considered that the remaining Sm has extreme dispersion. For the sample, as shown in FIG. 12, the deviation index SD(Lu) is slightly small and is 0.223. The deviation index SD(Sm) is 0.100. The difference index Dmm(Sm) is 1.85. The difference index Dmm(Sm) is 1.39. Although the value that corresponds to the segregation is small, clusters exist partially.

FIG. 25 corresponds to a sample 2FS-X3 (the sample including 17.5% Sm and 2.5% Lu). Although it is expected that 2.5% of Lu would cluster and segregate, the deviation index SD(Lu) is small and is 0.068; and the difference index Dmm(Lu) is 1.23. The deviation index SD(Sm) is 0.072; and the difference index Dmm(Sm) is 1.24. The level of the clustering can be discriminated from the difference index Dmm and the deviation index SD.

In the example recited above, the clustering substance is "Sm+Lu" (20% of the entirety); and in the case where the "Sm+Lu" is, for example, Sm being 15% of the entirety and Lu being 5% of the entirety, the Sm and the Lu that participate in the clustering formation are Sm being 5% of the entirety and Lu being 5% of the entirety. Because this is a total of 10% of the entirety, it is calculated that 50% of the clustering substance participates in the clustering. On the other hand, in the case where the Sm is 17.5% and the Lu is 2.5%, 2.5% for Sm and 2.5% for Lu, i.e., a total of 5%, participates in the clustering. In such a case, only 25% of the entire substance (20%) participates in the clustering. In the case where the participation rate is 50%, it can be seen from FIG. 25 that the clustering phenomenon is confirmed. On the other hand, in the case where the participation rate is 25%, a pronounced trend of clustering is not confirmed.

Figure 26:
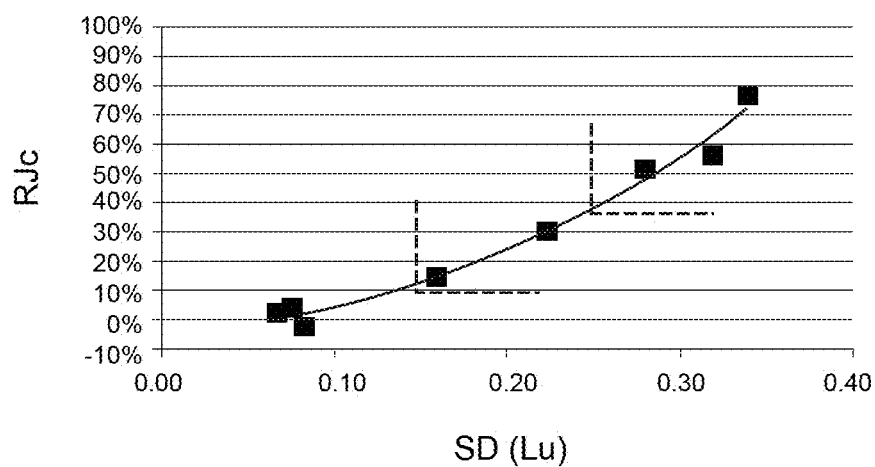
FIG. 26 is a graph showing a characteristic of the oxide superconductor.

FIG. 26 is a graph showing a characteristic of the oxide superconductor.

FIG. 26 shows the critical current density of a magnetic field of 0.9 T at a temperature of 77 K. The horizontal axis is the deviation index SD(Lu) of Lu. The vertical axis is a critical current density improvement rate RJc. The critical current density improvement rate RJc corresponds to the difference from the critical current density of the reference sample. The critical current density improvement rate RJc is standardized using the critical current density of the reference sample. The results obtained in the other experimental examples also are shown in FIG. 26 in addition to the sample described above.

The critical current density improvement rate RJc is low for the sample in which the value of the deviation index SD(Lu) is 0.07 to 0.09. There is substantially no change from the reference sample for the Jc-B characteristic. These samples correspond to extreme dispersion samples. It is considered that the critical current density substantially does not increase because the size of the artificial pin is too small.

On the other hand, the critical current density improvement rate RJc is high when the deviation index SD(Lu) is large. For such samples, a Ba substitution-type Sm artificial pin exists. If such an artificial pin is aggregated by clustering, the periphery of the substituted artificial pin site also becomes the artificial pin. Therefore, the Jc-B characteristic improves. The improvement of the characteristic is distinct when the deviation index SD(Lu) is 0.15 or more. When the deviation index SD(Lu) is higher than 0.25, the state becomes a more distinct clustering state; and the degree of the improvement of the characteristics is large. In the extreme dispersion state, the deviation index SD(Lu) is lower than 0.15.

Figure 27:
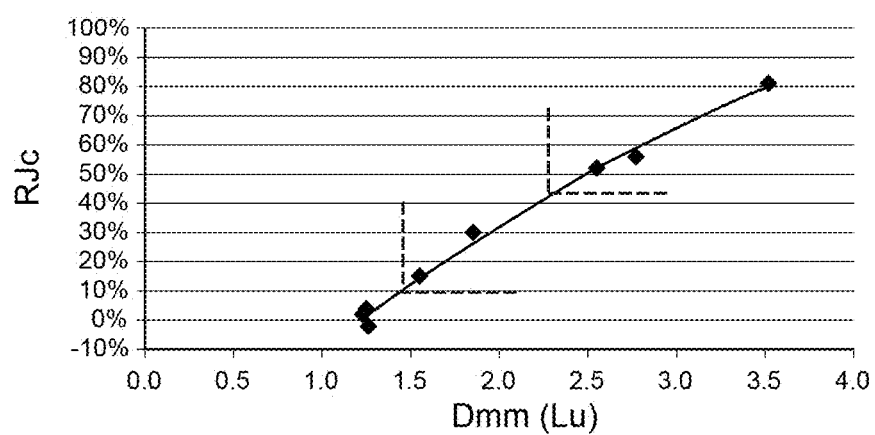
FIG. 27 is a graph showing a characteristic of the oxide superconductor.

FIG. 27 is a graph showing a characteristic of the oxide superconductor.

FIG. 27 shows the relationship between the difference index Dmm(Lu) of Lu and a critical current density in a magnetic field (77 K, 0.9 T) for the sample described in reference to FIG. 26. The horizontal axis of FIG. 27 is the difference index Dmm(Lu) of Lu. The vertical axis is the critical current density improvement rate RJc. The maximum value of the difference index Dmm is about 1.3 for the extreme dispersion sample.

As shown in FIG. 27, the critical current density increases when the difference index Dmm(Lu) exceeds 1.5. When the difference index Dmm(Lu) is 2.3 or more, clustering strongly occurs; and the improvement effect is more pronounced. When the difference index Dmm(Lu) is 3.5, a Jc value that is 1.81 times the reference sample is obtained.

Third Experimental Example

A coating solution for a YBCO superconductor is synthesized and refined using the solution flowchart shown in the chart of FIG. 3. A powder of hydrates of each of $Y(OCOCH_3)_3$, $Ba(OCOCH_3)_2$, and $Cu(OCOCH_3)_2$ is used as the metallic acetate. These hydrates are dissolved in deionized water at a metal-ion mole ratio of Y:Ba:Cu=1:2:3. Mixing and stirring with a stoichiometric quantity of $CF_3COOH$ are performed. The mixed solution that is obtained is placed in an eggplant-shaped flask; and reaction and refinement are performed for 12 hours inside a rotary evaporator at reduced pressure. Thereby, a semi-transparent blue substance 3MAi (the substance Material A with impurity described in the third experimental example) is obtained. Water or acetic acid which is a reaction by-product of the solution synthesis is included in the semi-transparent blue substance 3MAi at about 7 wt %.

The substance 3MAi is added to methanol corresponding to a weight of about 100 times the substance 3MAi (Cs-f of FIG. 3) and is completely dissolved. The solution is placed in a rotary evaporator; and reaction and refinement are performed for 12 hours at reduced pressure. Thereby, the semi-transparent blue substance 3MA is obtained. The semi-transparent blue substance 3MA is dissolved in methanol (Cs-j of FIG. 3) and diluted using a volumetric flask. Thereby, a coating solution 3Cs-Y (third experimental example, Coating Solution for Y-based superconductor) is obtained. The metal ion concentration is $1.50 \times 10^{-3}$ mol/m$^3$.

A coating solution for a superconductor of EuBCO, GdBCO, TbBCO, DyBCO, HoBCO, ErBCO, TmBCO, YbBCO, and LuBCO is synthesized and refined. For example, for EuBCO, Eu (OCOCH$_3$)$_3$ is used as the metallic acetate. Coating solutions 3Cs-Eu, 3Cs-Gd, 3Cs-Tb, 3Cs-Dy, 3Cs-Ho, 3Cs-Er, 3Cs-Tm, 3Cs-Yb, and 3Cs-Lu are obtained by similar methods for the other elements as well. These solutions are highly purified.

A semi-solution that includes Ba and Cu is synthesized and refined using the solution flowchart shown in the chart of FIG. 3. A powder of hydrates of each of Ba(OCOCH$_3$)$_2$ and Cu(OCOCH$_3$)$_2$ is dissolved in deionized water at a metal-ion mole ratio of Ba:Cu=2:3. Mixing and stirring with a stoichiometric quantity of CF$_3$COOH are performed. The mixed solution that is obtained is placed in an eggplant-shaped flask; and reaction and refinement are performed for 12 hours inside a rotary evaporator at reduced pressure. Thereby, a semi-transparent blue substance 3MDi is obtained. Water or acetic acid which is a reaction by-product of the solution synthesis is included in the semi-transparent blue substance 3MDi at about 7 wt %.

A substance 3MCi is added to methanol corresponding to a weight of about 100 times the substance 3MCi (Cs-f of FIG. 3) and is completely dissolved. The solution is placed in a rotary evaporator; and reaction and refinement are performed for 12 hours at reduced pressure. Thereby, a semi-transparent blue substance 3MC is obtained. The semi-transparent blue substance 3MC is dissolved in methanol (Cs-j of FIG. 3) and diluted using a volumetric flask. Thereby, a half coating solution 3hCs-BaCu (third experimental example, half coating Solution Ba and Cu) is obtained. The metal ion concentration is $1.50 \times 10^{-3}$ mol/m$^3$.

A semi-solution that includes Sm is synthesized and refined using the solution flowchart shown in the chart of FIG. 3. A powder of a hydrate of Sm(OCOCH$_3$)$_3$ is dissolved in deionized water. Mixing and stirring with a stoichiometric quantity of CF$_3$CF$_2$COOH is performed. The mixed solution that is obtained is placed in an eggplant-shaped flask; and reaction and refinement are performed for 12 hours inside a rotary evaporator at reduced pressure. Thereby, a semi-transparent yellow substance 3MEi is obtained.

The substance 3MDi is added to methanol corresponding to a weight of about 100 times the substance 3MDi (Cs-f of FIG. 3) and is completely dissolved. The solution is placed in a rotary evaporator; and reaction and refinement are performed for 12 hours at reduced pressure. Thereby, a semi-transparent yellow substance 3MD is obtained. The semi-transparent yellow substance 3MD is dissolved in methanol (Cs-j of FIG. 3) and diluted using a volumetric flask. Thereby, a half coating solution 3hCs-Sm step 1) is obtained. The metal ion concentration is $1.20 \times 10^{-3}$ mol/m$^3$.

TFA substitution of the PFP group is performed using the flowchart shown in FIG. 4 for the half coating solution 3hCs-Sm1 obtained as recited above. The half coating solution 3hCs-Sm1 is diluted 20 times by adding methanol; TFA corresponding to a stoichiometric quantity of PFP is added; and refinement is performed. Thereby, a half coating solution 3hCs-Sm2 (same as above, Step 2) is obtained.

The half coating solution 3hCs-BaCu and the half coating solution 3hCs-Sm2 are mixed so that Sm:Ba:Cu=1:2:3. Thereby, a coating solution 3Cs-Sm is obtained. The metal ion concentration of the coating solution is about $1.33 \times 10^{-3}$ mol/m$^3$.

The coating solutions 3Cs-Eu, 3Cs-Gd, 3Cs-Tb, 3Cs-Dy, 3Cs-Ho, 3Cs-Er, 3Cs-Tm, 3Cs-Yb, and 3Cs-Lu are mixed into the coating solutions 3Cs-Y and 3Cs-Sm. Thereby, coating solutions 3Cx-Eu, 3Cx-Gd, 3Cx-Tb, 3Cx-Dy, 3Cx-Ho, 3Cx-Er, 3Cx-Tm, 3Cs-Yb, and 3Cx-Lu are obtained. Y:Sm:Eu=80:10:10 for the coating solution 3Cx-Eu. Y:Sm:Gd=80:10:10 for the coating solution 3Cx-Gd. Y:Sm:Tb=80:10:10 for the coating solution 3Cx-Tb. Y:Sm:Dy=80:10:10 for the coating solution 3Cx-Dy. Y:Sm:Ho=80:10:10 for the coating solution 3Cx-Ho. Y:Sm:Er=80:10:10 for the coating solution 3Cx-Er. Y:Sm:Tm=80:10:10 for the coating solution 3Cx-Tm. Y:Sm:Yb=80:10:10 for a coating solution 3Cx-Yb. Y:Sm:Lu=80:10:10 for the coating solution 3Cx-Lu.

Film formation of a superconductor on a LaAlO$_3$ monocrystalline substrate is performed using the coating solutions 3Cx-Eu, 3Cx-Gd, 3Cx-Tb, 3Cx-Dy, 3Cx-Ho, 3Cx-Er, 3Cx-Tm, 3Cx-Yb, and 3Cx-Lu. The film formation is performed using spin coating at a maximum rotation speed of 4000 rpm. A pre-bake is performed in a pure oxygen atmosphere at 400 degrees C. or less using the profile shown in FIG. 6. A main bake is performed inside a 1000 ppm oxygen-mixed argon gas at 800 degrees C. using the profile shown in FIG. 7. Annealing is performed inside pure oxygen at 525 degrees C. or less. Thereby, samples 3FS-Eu (third experimental example, Film of Superconductor containing Eu), 3FS-Gd, 3FS-Tb, 3FS-Dy, 3FS-Ho, 3FS-Er, 3FS-Tm, 3FS-Yb, and 3FS-Lu of the superconducting film are obtained.

When realizing clustering, there is a trend of the results of the XRD measurement improving. When realizing clustering, the peak intensity improves; $\Delta\omega$ improves; and the unusual phase formation is suppressed. In the case where the single perovskite structure is realized, the structure is a single structure even in the case where multiple elements are introduced to Y sites. Therefore, even in the case where SmBCO, YBCO, and LuBCO exist, the peak positions of SmBCO, YBCO, and LuBCO are not observed separately at the original positions; and a single peak is observed. If a sufficient large clump of about 100 nm is formed for each of SmBCO and YBCO, peaks at the positions of angles 2θ of 46.53 degrees and 46.68 degrees respectively appear in the XRD; and the peaks appear to be separated. In the case of clustering, such separation of the peaks is not observed; and one peak is observed. In the case where direct observation is used for the clustering analysis, high-resolution TEM observation at 2 million times is necessary to observe the atomic image; and therefore, the clustering analysis undesirably becomes extremely expensive. If the clustering is realized, the improvement of the peak intensity, the improvement of $\Delta\omega$ and the characteristic of the (006) peak being one peak can be seen from the XRD measurement. It is possible to estimate the clustering by such a simple alternative analysis method.

In the XRD measurement of the samples 3FS-Dy, 3FS-Ho, 3FS-Er, 3FS-Tm, 3FS-Yb, and 3FS-Lu, a peak intensity that is more intense than that of YBCO is observed; $\Delta\omega$ is small; and the unusual phase formation is suppressed. For these samples, the (006) peak is observed as one peak. Conversely, in the XRD measurement of the samples 3FS-Eu, 3FS-Gd, and 3FS-Tb, the peak intensity is weaker than that of simple YBCO; $\Delta\omega$ is large; and unusual phases are formed. From the analysis results, it is considered that the clustering does not occur very intensely.

High-resolution TEM observation and EDS mapping measurements are implemented for the sample 3FS-Dy. The deviation index SD and the difference index Dmm are determined by analyzing ten 5 nm square regions. The deviation index SD(Dy) is 0.251; and the difference index Dmm(Dy) is 3.3. The clustering can be confirmed by the simple analysis method.

As recited above, clustering does not occur for the samples 3FS-Eu, 3FS-Gd, and 3FS-Tb. Or, the effect of the clustering is small. It is considered that this phenomenon is caused by the difference of the atomic radii. The atomic radius of Gd corresponds to the atomic radius of Y. Even in the case where it is attempted to realize clustering by using Gd and Sm, Y and Gd behave as one body because the atomic radius of Gd is near the atomic radius of Y; and it is estimated that the state substantially would be a state near the extreme dispersion of two mixed elements. The ionic radius of Eu is larger than the ionic radius of Y; and it is considered that a pronounced effect of the clustering is not obtained. It is considered that the effect of the clustering is small because the ionic radius of Tb is near the ionic radius of Y. In such a case, it is considered that clustering occurs in a microscopic region, even though the effect is small. For a lanthanoid element that has a larger atomic number than Gd, the difference between the atomic radii of two elements adjacent in the periodic table is small. Therefore, in the case where two elements that are adjacent in the periodic table are used, it is estimated that clustering does not occur easily.

Fourth Experimental Example

A coating solution for a YBCO superconductor is synthesized and refined using the solution flowchart shown in the chart of FIG. 3. A powder of hydrates of each of $Y(OCOCH_3)_3$, $Ba(OCOCH_3)_2$, and $Cu(OCOCH_3)_2$ is used as the metallic acetate. A powder of these hydrates is dissolved in deionized water at a metal-ion mole ratio of Y:Ba:Cu=1:2:3. Mixing and stirring with a stoichiometric quantity of $CF_3COOH$ are performed. The mixed solution that is obtained is placed in an eggplant-shaped flask; and reaction and refinement are performed for 12 hours inside a rotary evaporator at reduced pressure. Thereby, a semi-transparent blue substance 4MAi (the substance Material A with impurity described in the fourth experimental example) is obtained. Water or acetic acid which is a reaction by-product of the solution synthesis is included in the semi-transparent blue substance 4MAi at about 7 wt %.

The substance 4MAi is added to methanol corresponding to a weight of about 100 times the substance 4MAi (Cs-f of FIG. 3) and is completely dissolved. The solution is placed in a rotary evaporator; and reaction and refinement are performed for 12 hours at reduced pressure. Thereby, the semi-transparent blue substance 4MA is obtained. The semi-transparent blue substance 4MA is dissolved in methanol (Cs-j of FIG. 3) and diluted using a volumetric flask. Thereby, a coating solution 4Cs-Y (fourth experimental example, Coating Solution for Y-based superconductor) is obtained. The metal ion concentration is $1.50 \times 10^{-3}$ mol/m³.

A coating solution for a superconductor of DyBCO and TmBCO is synthesized and refined. For example, Dy(OCOCH$_3$)$_3$ is used as the metallic acetate for the DyBCO. A coating solution is obtained by a similar method for the TmBCO as well. Thereby, coating solutions 4Cs-Dy and 4Cs-Tm are obtained. These solutions are highly purified.

A semi-solution that includes Ba and Cu is synthesized and refined using the solution flowchart shown in the chart of FIG. 3. A powder of hydrates of each of $Ba(OCOCH_3)_2$ and $Cu(OCOCH_3)_2$ is dissolved in deionized water at a metal-ion mole ratio of Ba:Cu=2:3. Mixing and stirring with a stoichiometric quantity of $CF_3COOH$ are performed. The mixed solution that is obtained is placed in an eggplant-shaped flask; and reaction and refinement are performed for 12 hours inside a rotary evaporator at reduced pressure. Thereby, a semi-transparent blue substance 4MDi is obtained. Water or acetic acid which is a reaction by-product of the solution synthesis is included in the semi-transparent blue substance 4MDi at about 7 wt %.

A substance 4MCi is added to methanol corresponding to a weight of about 100 times the substance 4MCi (Cs-f of FIG. 3) and is completely dissolved. The solution is placed in a rotary evaporator; and reaction and refinement are performed for 12 hours at reduced pressure. Thereby, a semi-transparent blue substance 4MC is obtained. The semi-transparent blue substance 4MC is dissolved in methanol (Cs-j of FIG. 3) and diluted using a volumetric flask. Thereby, a half coating solution 4hCs-BaCu (fourth experimental example, half coating Solution Ba and Cu) is obtained. The metal ion concentration is $1.50 \times 10^{-3}$ mol/m³.

A semi-solution that includes Nd is synthesized and refined using the solution flowchart shown in the chart of FIG. 3. A powder of a hydrate of $Nd(OCOCH_3)_3$ is dissolved in deionized water. Mixing and stirring with a stoichiometric quantity of $CF_3CF_2COOH$ are performed. The mixed solution that is obtained is placed in an eggplant-shaped flask; and reaction and refinement are performed for 12 hours inside a rotary evaporator at reduced pressure. Thereby, a semi-transparent yellow substance 4MEi is obtained.

The substance 4MDi is added to methanol corresponding to a weight of about 100 times the substance 4MDi (Cs-f of FIG. 3) and is completely dissolved. The solution is placed in a rotary evaporator; and reaction and refinement are performed for 12 hours at reduced pressure. Thereby, a semi-transparent yellow substance 4MD is obtained. The semi-transparent yellow substance 4MD is dissolved in methanol (Cs-j of FIG. 3) and diluted using a volumetric flask. Thereby, a half coating solution 4hCs-Nd1 (fourth experimental example, Half coating Solution Nd step 1) is obtained. The metal ion concentration is $0.80 \times 10^{-3}$ mol/m³.

TFA substitution of the PFP group is performed using the flowchart shown in FIG. 4 for the half coating solution 4hCs-Nd1 obtained as recited above. The half coating solution 4hCs-Nd1 is diluted 20 times by adding methanol; TFA corresponding to a stoichiometric quantity of PFP is added; and refinement is performed. Thereby, a half coating solution 4hCs-Nd2 (same as above, Step 2) is obtained.

The half coating solution 4hCs-BaCu and the half coating solution 4hCs-Nd2 are mixed so that Nd:Ba:Cu=1:2:3. Thereby, a coating solution 4Cs-Nd is obtained. The metal ion concentration of the coating solution is about $1.31 \times 10^{-3}$ mol/m³.

A coating solution 4Cx-Dy is obtained by mixing the coating solution 4Cs-Dy into the coating solution 4Cs-Y and the coating solution 4Cs-Nd so that Y:Nd:Dy is 80:10:10. A coating solution 4Cx-Tm is obtained by mixing the coating solution 4Cs-Tm into the coating solution 4Cs-Y and the coating solution 4Cs-Nd so that Y:Nd:Tm is 80:10:10.

The film formation of a superconductor on a $LaAlO_3$ monocrystalline substrate is performed using the coating solutions 4Cx-Dy and 4Cx-Tm. The film formation is performed using spin coating at a maximum rotation speed of 4000 rpm. A pre-bake is performed in a pure oxygen atmosphere at 400 degrees C. or less using the profile shown in FIG. 6. A main bake is performed inside a 1000 ppm oxygen-mixed argon gas at 800 degrees C. using the profile shown in FIG. 7. Annealing is performed in pure oxygen at 525 degrees C. or less. Thereby, a sample 4FS-Dy (fourth experimental example, Film of Superconductor containing Dy) and a sample 4FS-Tm of the superconducting film are obtained.

When realizing clustering, there is a trend of the results of the XRD measurement improving. For these samples, the peak intensity is improved; $\Delta\omega$ is improved; and the unusual phase formation is suppressed. For 4FS-Dy and 4FS-Tm, it can be seen that the (006) of the XRD measurement is a single peak; and the structure is a single perovskite structure.

High-resolution TEM observation and EDS mapping measurements are implemented for the samples 4FS-Dy and 4FS-Tm. The analysis of ten 5 nm square regions is performed. The deviation index SD and the difference index Dmm are determined. For the sample 4FS-Dy, the deviation index SD(Dy) is 0.213; and the difference index Dmm(Dy) is 2.78. For the sample 4FS-Tm, the deviation index SD(Tm) is 0.263; and the difference index Dmm(Tm) is 3.12. For these samples, it is considered that clusters exist.

The atomic radius of Nd is large. Therefore, similarly to Sm, the solution preparation is difficult for Nd. For example, a method of PFP synthesis and substitution is used. Thereby, a sample that has clustering can be made. When using Nd, similarly to when using Sm, it is easy to form the artificial pin by Ba substitution. A magnetic field characteristic improvement effect is obtained for the Nd-based superconducting material.

Fifth Experimental Example

A coating solution for a YBCO superconductor is synthesized and refined using the solution flowchart shown in the chart of FIG. 3. A powder of hydrates of each of Tm (OCOCH$_3$)$_3$, Ba(OCOCH$_3$)$_2$, and Cu(OCOCH$_3$)$_2$ is used as the metallic acetate. These hydrates are dissolved in deionized water at a metal-ion mole ratio of Tm:Ba:Cu=1:2:3. Mixing and stirring with a stoichiometric quantity of CF$_3$COOH are performed. The mixed solution that is obtained is placed in an eggplant-shaped flask; and reaction and refinement are performed for 12 hours inside a rotary evaporator at reduced pressure. Thereby, a semi-transparent blue substance 5MAi (the substance Material A with impurity described in the fifth experimental example) is obtained. Water or acetic acid which is a reaction by-product of the solution synthesis is included in the semi-transparent blue substance 5MAi at about 7 wt %.

The substance 5MAi is added to methanol corresponding to a weight of about 100 times the substance 5MAi (Cs-f of FIG. 3) and is completely dissolved. The solution is placed in a rotary evaporator; and reaction and refinement are performed for 12 hours at reduced pressure. Thereby, the semi-transparent blue substance 5MA is obtained. The semi-transparent blue substance 5MA is dissolved in methanol (Cs-j of FIG. 3) and diluted using a volumetric flask. Thereby, a coating solution 5Cs-Tm (fifth experimental example, Coating Solution for Tm-based superconductor) is obtained. The metal ion concentration is $1.50 \times 10^{-3}$ mol/m$^3$.

A coating solution for a YbBCO superconductor is synthesized and refined. For the TmBCO, Yb (OCOCH$_3$)$_3$ is used as the metallic acetate. A coating solution 5Cs-Yb solution is obtained by a method similar to that recited above. The solution is highly purified.

A semi-solution that includes Ba and Cu is synthesized and refined using the solution flowchart shown in the chart of FIG. 3. A powder of hydrates of each of Ba(OCOCH$_3$)$_2$ and Cu(OCOCH$_3$)$_2$ are dissolved in deionized water at a metal-ion mole ratio of Ba:Cu=2:3 Mixing and stirring with a stoichiometric quantity of CF$_3$COOH are performed. The mixed solution that is obtained is placed in an eggplant-shaped flask; and reaction and refinement are performed for 12 hours inside a rotary evaporator at reduced pressure. Thereby, a semi-transparent blue substance 5MDi is obtained. Water or acetic acid which is a reaction by-product of the solution synthesis is included in the semi-transparent blue substance 5MDi at about 7 wt %.

A substance 5MCi is added to methanol corresponding to a weight of about 100 times the substance 5MCi (Cs-f of FIG. 3) and is completely dissolved. The solution is placed in a rotary evaporator; and reaction and refinement are performed for 12 hours at reduced pressure. Thereby, a semi-transparent blue substance 5MC is obtained. The semi-transparent blue substance 5MC is dissolved in methanol (Cs-j of FIG. 3) and diluted using a volumetric flask. Thereby, a half coating solution 5hCs-BaCu (fifth experimental example, half coating Solution Ba and Cu) is obtained. The metal ion concentration is $1.50 \times 10^{-3}$ mol/m$^3$.

A semi-solution that includes Sm is synthesized and refined using the solution flowchart shown in the chart of FIG. 3. A powder of a hydrate of Sm(OCOCH$_3$)$_3$ is dissolved in deionized water. Mixing and stirring with a stoichiometric quantity of CF$_3$CF$_2$COOH are performed. The mixed solution that is obtained is placed in an eggplant-shaped flask; and reaction and refinement are performed for 12 hours inside a rotary evaporator at reduced pressure. Thereby, a semi-transparent yellow substance 5MEi is obtained.

The substance 5MDi is added to methanol corresponding to a weight of about 100 times the substance 5MDi (Cs-f of FIG. 3) and is completely dissolved. The solution is placed in a rotary evaporator; and reaction and refinement are performed for 12 hours at reduced pressure. Thereby, a semi-transparent yellow substance 5MD is obtained. The semi-transparent yellow substance 5MD is dissolved in methanol (Cs-j of FIG. 3) and diluted using a volumetric flask. Thereby, a half coating solution 5hCs-Sm1 (fifth experimental example, Half coating Solution Sm step 1) is obtained. The metal ion concentration is $1.20 \times 10^{-3}$ mol/m$^3$.

TFA substitution of the PFP group is performed using the flowchart shown in FIG. 4 for the half coating solution 5hCs-Sm1 obtained as recited above. The half coating solution 5hCs-Sm1 is diluted 20 times by adding methanol; TFA corresponding to a stoichiometric quantity of PFP is added; and refinement is performed. Thereby, a half coating solution 5hCs-Sm2 (same as above, Step 2) is obtained.

The half coating solution 5hCs-BaCu and the half coating solution 5hCs-Sm2 are mixed so that Sm:Ba:Cu=1:2:3. Thereby, a coating solution 5Cs-Sm is obtained. The metal ion concentration of the coating solution is about $1.44 \times 10^{-3}$ mol/m$^3$.

The coating 5Cs-Yb is mixed into the coating solution 5Cs-Sm and the coating solution 5Cs-Tm so that Yb:Sm:Tm=80:10:10. Thereby, a coating solution 5Cx is obtained.

Film formation of a superconductor on a LaAlO$_3$ monocrystalline substrate is performed using the coating solution 5Cx. The film formation is performed using spin coating at a maximum rotation speed of 4000 rpm. A pre-bake is performed in a pure oxygen atmosphere at 400 degrees C. or less using the profile shown in FIG. 6. A main bake is performed inside a 1000 ppm oxygen-mixed argon gas at 800 degrees C. using the profile shown in FIG. 7. Annealing is performed inside pure oxygen at 525 degrees C. or less. Thereby, a sample 5FS (fifth experimental example, Film of Superconductor) of the superconducting film is obtained.

When realizing clustering, there is a trend of the results of the XRD measurement improving. In these samples, the peak intensity improves; AN improves; and the unusual phase formation is suppressed. For 5FS-Dy and 5FS-Tm, it can be seen that the (006) peak of the XRD measurement is a single peak; and the structure is a single perovskite structure.

High-resolution TEM observation and EDS mapping measurements are implemented for the sample 5FS. The analysis of ten 5 nm square regions is performed; and the deviation index SD and the difference index Dmm are determined. The deviation index SD is 0.316; and the difference index Dmm is 4.43.

In the example, Yb corresponds to the main material.

The clustering phenomenon occurs even in the case where the main material is not Y. The clustering occurs for the lanthanoid group. It is considered that Y behaves as an element in the vicinity of Gd in the clustering.

Sixth Experimental Example

A coating solution for a superconductor of PrBCO+YBCO is synthesized and refined using the solution flowchart shown in the chart of FIG. 3. A powder of hydrates of each of Pr $(OCOCH_3)_3$, Y$(OCOCH_3)_3$, Ba$(OCOCH_3)_2$, and Cu$(OCOCH_3)_2$ is used as the metallic acetate. These powders are dissolved in deionized water at a metal-ion mole ratio of Pr:Y:Ba:Cu=0.05:0.95:2:3. Mixing and stirring with a stoichiometric quantity of $CF_3COOH$ are performed. The mixed solution that is obtained is placed in an eggplant-shaped flask; and reaction and refinement are performed for 12 hours inside a rotary evaporator at reduced pressure. Thereby, a semi-transparent blue substance 6MAi (the substance Material A with impurity described in the sixth experimental example) is obtained. Water or acetic acid which is a reaction by-product of the solution synthesis is included in the semi-transparent blue substance 6MAi at about 7 wt %.

The substance 6MAi is added to methanol corresponding to a weight of about 100 times the substance 6MAi (Cs-f of FIG. 3) and is completely dissolved. The solution is placed in a rotary evaporator; and reaction and refinement are performed for 12 hours at reduced pressure. Thereby, the semi-transparent blue substance 6MA is obtained. The semi-transparent blue substance 6MA is dissolved in methanol (Cs-j of FIG. 3) and diluted using a volumetric flask. Thereby, a coating solution 6Cs-Y (sixth experimental example, Coating Solution for Y-based superconductor) is obtained. The metal ion concentration is $1.50 \times 10^{-3}$ mol/m$^3$.

A coating solution for a LuBCO superconductor is synthesized and refined. Lu$(OCOCH_3)_3$ is used as the metallic acetate. A coating solution 6Cs-Lu is obtained by a similar method. The solution is highly purified.

A semi-solution that includes Ba and Cu is synthesized and refined using the solution flowchart shown in the chart of FIG. 3. A powder of hydrates of each of Ba$(OCOCH_3)_2$ and Cu$(OCOCH_3)_2$ is dissolved in deionized water at a metal-ion mole ratio of Ba:Cu=2:3. Mixing and stirring with a stoichiometric quantity of $CF_3COOH$ are performed. The mixed solution that is obtained is placed in an eggplant-shaped flask; and reaction and refinement are performed for 12 hours inside a rotary evaporator at reduced pressure. Thereby, a semi-transparent blue substance 6MDi is obtained. Water or acetic acid which is a reaction by-product of the solution synthesis is included in the semi-transparent blue substance 6MDi at about 7 wt %.

A substance 6MCi is added to methanol corresponding to a weight of about 100 times the substance 6MCi (Cs-f of FIG. 3) and is completely dissolved. The solution is placed in a rotary evaporator; and reaction and refinement are performed for 12 hours at reduced pressure. Thereby, a semi-transparent blue substance 6MC is obtained. The semi-transparent blue substance 6MC is dissolved in methanol (Cs-j of FIG. 3) and diluted using a volumetric flask. Thereby, a half coating solution 6hCs-BaCu (sixth experimental example, half coating Solution Ba and Cu) is obtained. The metal ion concentration is $1.50 \times 10^{-3}$ mol/m$^3$.

A semi-solution that includes Sm is synthesized and refined using the solution flowchart shown in the chart of FIG. 3. A powder of a hydrate of Sm$(OCOCH_3)_3$ is dissolved in deionized water. Mixing and stirring with a stoichiometric quantity of $CF_3CF_2COOH$ are performed. The mixed solution that is obtained is placed in an eggplant-shaped flask; and reaction and refinement are performed for 12 hours inside a rotary evaporator at reduced pressure. Thereby, a semi-transparent yellow substance 6MEi is obtained.

The substance 6MDi is added to methanol corresponding to a weight of about 100 times the substance 6MDi (Cs-f of FIG. 3) and is completely dissolved. The solution is placed in a rotary evaporator; and reaction and refinement are performed for 12 hours at reduced pressure. Thereby, a semi-transparent yellow substance 6MD is obtained. The semi-transparent yellow substance 6MD is dissolved in methanol (Cs-j of FIG. 3) and diluted using a volumetric flask. Thereby, a half coating solution 6hCs-Sm1 (sixth experimental example, Half coating Solution Sm step 1) is obtained. The metal ion concentration is $1.20 \times 10^{-3}$ mol/m$^3$.

TFA substitution of the PFP group is performed using the flowchart shown in FIG. 4 for the half coating solution 6hCs-Sm1. The half coating solution 6hCs-Sm1 is diluted 20 times by adding methanol; TFA corresponding to a stoichiometric quantity of PFP is added; and refinement is performed. Thereby, a half coating solution 6hCs-Sm2 (same as above, Step 2) is obtained.

The half coating solution 6hCs-BaCu and the half coating solution 6hCs-Sm2 are mixed so that Sm:Ba:Cu=1:2:3. Thereby, a coating solution 6Cs-Sm is obtained. The metal ion concentration of the coating solution is about $1.44 \times 10^{-3}$ mol/m$^3$.

A coating solution 6Cs-PrY and the coating solution 6Cs-Sm are mixed so that Y:Pr:Sm=90:5:5. Thereby, a coating solution 6Cx-Sm is obtained. The coating solution 6Cs-PrY and the coating solution 6Cs-Lu are mixed so that Y:Pr:Lu=90:5:5. Thereby, a coating solution 6Cx-Lu is obtained.

Film formation of a superconductor on a $LaAlO_3$ monocrystalline substrate is performed using the coating solution 6Cx-Sm or the coating solution 6Cx-Lu. The film formation is performed using spin coating at a maximum rotation speed of 4000 rpm. A pre-bake is performed in a pure oxygen atmosphere at 400 degrees C. or less using the profile shown in FIG. 6. A main bake is performed inside a 1000 ppm oxygen-mixed argon gas at 800 degrees C. using the profile shown in FIG. 7. Annealing is performed inside pure oxygen at 525 degrees C. or less. Thereby, a sample 6FS-Sm (sixth experimental example, Film of Superconductor containing Sm) and a sample 6FS-Lu of the superconducting film are obtained.

When realizing clustering, there is a trend of the results of the XRD measurement improving. For these samples, the peak intensity improves; Aw improves; and the unusual phase formation is suppressed. For 6FS-Lu, it can be seen that the (006) peak of the XRD measurement is a single peak; and the structure is a single perovskite structure. For 6FS-Sm, the (006) peak was weak.

High-resolution TEM observation and EDS mapping measurements are implemented for the samples 6FS-Sm and 6FS-Lu. The analysis of ten 5 nm square regions is performed; and the deviation index SD and the difference index Dmm are determined. For the sample 6FS-Sm, the deviation index SD(Sm) is 0.080; and the difference index Dmm(Sm) is 1.24. For the sample 6FS-Lu, the deviation index SD(Lu) is 0.23; and the difference index Dmm(Lu) is 2.8.

In a coating solution synthesis of the PrBCO that includes solitary Pr at the Y sites, the atomic radius of Pr is large; chemical reactions occur easily; and decomposition due to esterification in the TFA salt synthesis is severe. Therefore, at the current point in time, the Pr can be mixed with Y only up to 5%. In other words, the synthesis succeeds only for a coating solution in which 95% Y and 5% Pr are introduced to the Y sites. However, it appears that clustering occurs when selecting Pr and Lu as M1 and M3. In the embodiment, the synthesis of the coating solution succeeds when 5% Pr and 5% Lu are mixed with 90% Y. From the sixth experiment, it is considered that Pr behaves in the clustering as an element having an ionic radius larger than that of Nd. Pr is said to be non-superconducting trivalent to tetravalent. When Pr is tetravalent, the atomic radius of Pr is small. For a perovskite structure that includes Pr, it is considered that Pr is trivalent when forming the perovskite structure and subsequently becomes tetravalent. Clustering occurs for an artificial pin including Pr as well.

Seventh Experimental Example

A coating solution for a YBCO superconductor is synthesized and refined using the solution flowchart shown in the chart of FIG. 3. A powder of hydrates of each of $Y(OCOCH_3)_3$, $Ba(OCOCH_3)_2$, and $Cu(OCOCH_3)_2$ is used as the metallic acetate. The powder of these hydrates is dissolved in deionized water at a metal-ion mole ratio of Y:Ba:Cu=1:2:3. Mixing and stirring with a stoichiometric quantity of $CF_3COOH$ are performed. The mixed solution that is obtained is placed in an eggplant-shaped flask; and reaction and refinement are performed for 12 hours inside a rotary evaporator at reduced pressure. Thereby, a semi-transparent blue substance 7MAi (the substance Material A with impurity described in the seventh experimental example) is obtained. Water or acetic acid which is a reaction by-product of the solution synthesis is included in the semi-transparent blue substance 7MAi at about 7 wt %.

The substance 7MAi is added to methanol corresponding to a weight of about 100 times the substance 7MAi (Cs-f of FIG. 3) and is completely dissolved. The solution is placed in a rotary evaporator; and reaction and refinement are performed for 12 hours at reduced pressure. Thereby, the semi-transparent blue substance 7MA is obtained. The semi-transparent blue substance 7MA is dissolved in methanol (Cs-j of FIG. 3) and diluted using a volumetric flask. Thereby, a coating solution 7Cs-Y (seventh experimental example, Coating Solution for Y-based superconductor) is obtained. The metal ion concentration is $1.50 \times 10^{-3}$ mol/m$^3$.

A coating solution for a superconductor of DyBCO and TmBCO is synthesized and refined. For example, for the DyBCO, $Dy(OCOCH_3)_3$ is used as the metallic acetate. Coating solutions 7Cs-Dy and 7Cs-Tm are obtained by a similar method.

These coating solutions are highly purified.

A semi-solution that includes Ba and Cu is synthesized and refined using the solution flowchart shown in the chart of FIG. 3. A powder of hydrates of each of $Ba(OCOCH_3)_2$ and $Cu(OCOCH_3)_2$ is dissolved in deionized water at a metal-ion mole ratio of Ba:Cu=2:3 Mixing and stirring with a stoichiometric quantity of $CF_3COOH$ are performed. The mixed solution that is obtained is placed in an eggplant-shaped flask; and reaction and refinement are performed for 12 hours inside a rotary evaporator at reduced pressure. Thereby, a semi-transparent blue substance 7MDi is obtained. Water or acetic acid which is a reaction by-product of the solution synthesis is included in the semi-transparent blue substance 7MDi at about 7 wt %.

A substance 7MCi is added to methanol corresponding to a weight of about 100 times the substance 7MCi (Cs-f of FIG. 3) and is completely dissolved. The solution is placed in a rotary evaporator; and reaction and refinement are performed for 12 hours at reduced pressure. Thereby, a semi-transparent blue substance 7MC is obtained. The semi-transparent blue substance 7MC is dissolved in methanol (Cs-j of FIG. 3) and diluted using a volumetric flask. Thereby, a half coating solution 7hCs-BaCu (seventh experimental example, half coating Solution Ba and Cu) is obtained. The metal ion concentration is $1.50 \times 10^{-3}$ mol/m$^3$.

A semi-solution that includes Sm is synthesized and refined using the solution flowchart shown in the chart of FIG. 3. A powder of a hydrate of $Sm(OCOCH_3)_3$ is dissolved in deionized water. Mixing and stirring with a stoichiometric quantity of $CF_3CF_2COOH$ are performed. The mixed solution that is obtained is placed in an eggplant-shaped flask; and reaction and refinement are performed for 12 hours inside a rotary evaporator at reduced pressure. Thereby, a semi-transparent yellow substance 7MEi is obtained.

The substance 7MDi is added to methanol corresponding to a weight of about 100 times the substance 7MDi (Cs-f of FIG. 3) and is completely dissolved. The solution is placed in a rotary evaporator; and reaction and refinement are performed for 12 hours at reduced pressure. Thereby, a semi-transparent yellow substance 7MD is obtained. The semi-transparent yellow substance 7MD is dissolved in methanol (Cs-j of FIG. 3) and diluted using a volumetric flask. Thereby, a half coating solution 7hCs-Sm1 (seventh experimental example, Half coating Solution Sm step 1) is obtained. The metal ion concentration is $0.80 \times 10^{-3}$ mol/m$^3$.

TFA substitution of the PFP group is performed using the flowchart shown in FIG. 4 for the half coating solution 7hCs-Sm1. The half coating solution 7hCs-Sm1 is diluted 20 times by adding methanol; TFA corresponding to a stoichiometric quantity of PFP is added; and refinement is performed. Thereby, a half coating solution 7hCs-Sm2 (same as above, Step 2) is obtained.

The half coating solution 7hCs-BaCu and the half coating solution 7hCs-Sm2 are mixed so that Sm:Ba:Cu=1:2:3. Thereby, a coating solution 7Cs-Sm is obtained. The metal ion concentration of the coating solution is about $1.31 \times 10^{-3}$ mol/m$^3$.

A coating solution 7Cx-DyTm is obtained by mixing the coating solutions 7Cs-Dy and 7Cs-Tm into the coating solutions 7Cs-Y and 7Cs-Sm. For the coating solution 7Cx-DyTm, the concentration Y:Sm:Dy:Tm of the metal ion introduced to the Y site is 80:10:5:5.

Film formation of a superconductor on a $LaAlO_3$ monocrystalline substrate is performed using the coating solution 7Cx-DyTm. The film formation is performed using spin coating at a maximum rotation speed of 4000 rpm. A pre-bake is performed in a pure oxygen atmosphere at 400 degrees C. or less using the profile shown in FIG. 6. A main bake is performed inside a 1000 ppm oxygen-mixed argon gas at 800 degrees C. using the profile shown in FIG. 7. Annealing is performed inside pure oxygen at 525 degrees C. or less. Thereby, a sample 7FS-DyTm (seventh experimental example, Film of Superconductor containing Dy) of the superconducting film is obtained.

When realizing clustering, there is a trend of the results of the XRD measurement improving. For the sample, the peak intensity improves; Oro improves; and the unusual phase formation is suppressed. For 7FS-DyTm, it can be seen that the (006) peak of the XRD measurement is a single peak; and the structure is a single perovskite structure.

High-resolution TEM observation and EDS mapping measurements are implemented for 7FS-DyTm. The analysis of ten 5 nm square regions is performed; and the deviation index SD and the difference index Dy are determined. The deviation index SD(Dy) is 0.24; and the deviation index SD(Tm) is 0.26. The difference index Dmm(Dy) is 2.90; and the difference index Dmm(Tm) is 3.01. Clustering occurs for the sample. It is considered that the clustering is dependent on, for example, the difference between the lattice constants when forming the perovskite structure. Multiple types of elements may be used as at least one of the element M1 or the element M3 included in the cluster.

In the embodiment, in the superconductor that has a Y-based perovskite structure, clustering is performed by, for example, causing a perovskite structure having a size larger than the size of the unit cell of a perovskite structure of the superconductor used as the parent phase to be adjacent to the unit cell and by causing a perovskite structure having a size smaller than the size of the unit cell to be adjacent to the unit cell. The size of the duster is about several times (e.g., not less than 5 times and not more than 25 times) the size of the unit cell (e.g., about 0.4 nm). In the embodiment, a non-superconducting substance is used in one superconductor forming a duster. For example, the element that is included in the superconductor forming the cluster may be selectively substituted by Ba substitution processing, etc. Thereby, an artificial pin having a nanolevel size is obtained. Thereby, the characteristics are improved. According to the embodiment, a nano-sized cluster is formed for the first time. The embodiment is applicable to magnetic field characteristic improvement. The embodiment is applicable to fields relating to the magnetic field characteristics.

The magnetic field characteristics of a superconducting wire made by TFA-MOD are improved by an artificial pin. Thereby, various superconducting coil applications may develop. For the cluster according to the embodiment, it is considered that it is possible to control the size of the cluster using the film formation temperature or moisture amount of the superconductor film, the introduced element amount, etc. Any size of the artificial pin is obtained. According to the embodiment, the superconducting market is enlarged; the base of industry is broadened; and new original ideas or objectives are induced.

According to the embodiment, an oxide superconductor and a method for manufacturing the oxide superconductor that can increase the critical current density in a magnetic field can be provided.

REFERENCE DOCUMENTS

[1] M. Rupich, et al., Supercond. Sci. Technol., 23, (2010), 014015(9pp)
[2] T. Araki, et al., JP 4, 738, 322; U.S. Pat. No. 7,833,941 B2, (2006)
[3] T. Araki, et al., J. Appl. Phys., 92, (2002), 3318-3325
[4] T. Araki, Bull. Chem. Soc. Jpn., 77, (2004), 1051-1061

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing an oxide superconductor, comprising:

forming an oxide superconductor as a film by making a gel film using a methanol solution, by two or more refining processes to expel water and acetic acid from the methanol solution, by obtaining a pre-bake film of an oxide and fluoride by decomposing a trifluoroacetic acid group in a pre-bake process, by forming a perovskite structure having a number of oxygen atoms of 6.0 in a main bake in a humidified atmosphere of 725 to 850 degrees C., and by performing oxygen annealing, the methanol solution having metal trifluoroacetate hydrate as a major component, a mole ratio of metallic elements of RE:Ba:Cu being 1:2:3, (RE being one element selected from a "RE element group" of Pr, Nd, Sm, Eu, Gd, Y, Tb, Dy, Ho, Er, Tm, Yb, and Lu) wherein RE includes at least three types of metallic elements (M1, M2, and M3) in a superconducting: layer, the three types of metallic elements being any element of the RE element group selected in order, R(M1)≤20 mol % and R(M2)≥60 mol % and R(M3)≤20 mol % being satisfied to obtain REBa$_2$Cu$_3$O$_{7-x}$ having a single perovskite structure oriented in a c-axis, R(M1) being an average metallic element ratio of M1 in M1+M2+M3, R(M2) being an average metallic element ratio of M2 in M1+M2+M3, R(M3) being an average metallic element ratio of M3 in M1+M2+M3, SD(Ms)>0.15 being satisfied at a position at 50% of an average superconducting film thickness of a cross section including the c-axis oriented superconducting layer, if R(M1) is equal to or smaller than R(M3), Ms is M1, SD(Ms) being a standard deviation of concentration values of Ms over the average value of the Ms concentration.

2. The method of claim 1, wherein the M1 is Pr, Nd, or Sm.

3. The method of claim 1, wherein the first film is provided on a base member included in the base body, or the first film is provided on an intermediate layer provided on the base member.

4. The method of claim 1, wherein high purification processing of the solution is performed.

5. The method of claim 1, wherein the solution is made by processes including a process using pentafluoropropionic acid, and a process of substituting trifluoroacetic acid for at least a portion of the pentafluoropropionic acid after the process using the pentafluoropropionic acid.

6. The method of claim 1, wherein the M1 is Nd.

7. The method of claim 1, wherein the M1 is Sm.

8. The method of claim 1, wherein the M1 is Pr.

* * * * *